(12) United States Patent
Lin et al.

(10) Patent No.: US 12,315,768 B2
(45) Date of Patent: May 27, 2025

(54) PACKAGE ASSEMBLY INCLUDING LID WITH ADDITIONAL STRESS MITIGATING FEET AND METHODS OF MAKING THE SAME

(71) Applicant: Taiwan Semiconductor Manufacturing Company Limited, Hsinchu (TW)

(72) Inventors: Yu-Sheng Lin, Zhubei (TW); Shu-Shen Yeh, Taoyuan (TW); Chin-Hua Wang, New Taipei (TW); Po-Yao Lin, Zhudong Township (TW); Shin-Puu Jeng, Hsinchu (TW); Chien Hung Chen, Taipei (TW); Chia-Kuei Hsu, Hsinchu (TW); Po-Chen Lai, Hsinchu (TW); Yu Chen Lee, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 329 days.

(21) Appl. No.: 17/748,335

(22) Filed: May 19, 2022

(65) Prior Publication Data
US 2023/0018343 A1    Jan. 19, 2023

Related U.S. Application Data

(60) Provisional application No. 63/222,234, filed on Jul. 15, 2021.

(51) Int. Cl.
*H01L 23/055* (2006.01)
*H01L 21/48* (2006.01)
(Continued)

(52) U.S. Cl.
CPC ........ *H01L 23/055* (2013.01); *H01L 21/4871* (2013.01); *H01L 23/10* (2013.01);
(Continued)

(58) Field of Classification Search
CPC ... H01L 23/055; H01L 23/10; H01L 21/4871; H01L 25/0655; H01L 24/16; H01L 24/32;
(Continued)

(56) References Cited

U.S. PATENT DOCUMENTS 5,311,402 A * 5/1994 Kobayashi ............. H01L 24/29
174/17.05
5,623,394 A * 4/1997 Sherif ................. H01L 23/3737
257/713

(Continued)

*Primary Examiner* — Peniel M Gumedzoe
(74) *Attorney, Agent, or Firm* — The Marbury Law Group, PLLC

(57) ABSTRACT

A package assembly includes a package substrate, a package lid located on the package substrate and including a plate portion, an outer foot extending from the plate portion, and an inner foot having a height greater than or equal to a height of the outer foot, extending from the plate portion and including a first inner foot corner portion located inside a first corner of the outer foot, and an adhesive that adheres the outer foot to the package substrate and adheres the inner foot to the package substrate.

20 Claims, 32 Drawing Sheets

(51) Int. Cl.
*H01L 23/10* (2006.01)
*H01L 25/065* (2023.01)
*H01L 23/00* (2006.01)

(52) U.S. Cl.
CPC .......... *H01L 25/0655* (2013.01); *H01L 24/16* (2013.01); *H01L 24/32* (2013.01); *H01L 24/73* (2013.01); *H01L 2224/16235* (2013.01); *H01L 2224/32225* (2013.01); *H01L 2224/73204* (2013.01); *H01L 2924/1431* (2013.01); *H01L 2924/1436* (2013.01); *H01L 2924/15311* (2013.01); *H01L 2924/1611* (2013.01); *H01L 2924/16153* (2013.01); *H01L 2924/16251* (2013.01); *H01L 2924/1631* (2013.01); *H01L 2924/1632* (2013.01); *H01L 2924/1811* (2013.01); *H01L 2924/182* (2013.01); *H01L 2924/35121* (2013.01)

(58) Field of Classification Search
CPC ........... H01L 24/73; H01L 2224/16235; H01L 2224/32225; H01L 2224/73204; H01L 2229/1431; H01L 2229/1436; H01L 2229/15311; H01L 2229/1611; H01L 2229/16153; H01L 2229/16251; H01L 2229/1631; H01L 2229/1632; H01L 2229/1811; H01L 2229/182; H01L 2229/35121
See application file for complete search history.

(56) References Cited

U.S. PATENT DOCUMENTS

| | | | |
|---|---|---|---|
| 9,892,990 B1* | 2/2018 | Galloway | H01L 23/10 |
| 2004/0150977 A1* | 8/2004 | Hsieh | H01L 23/3128 |
| | | | 257/E23.114 |
| 2016/0093578 A1* | 3/2016 | Penunuri | H01L 25/16 |
| | | | 257/532 |
| 2016/0233141 A1* | 8/2016 | Hirobe | H01L 23/04 |

\* cited by examiner

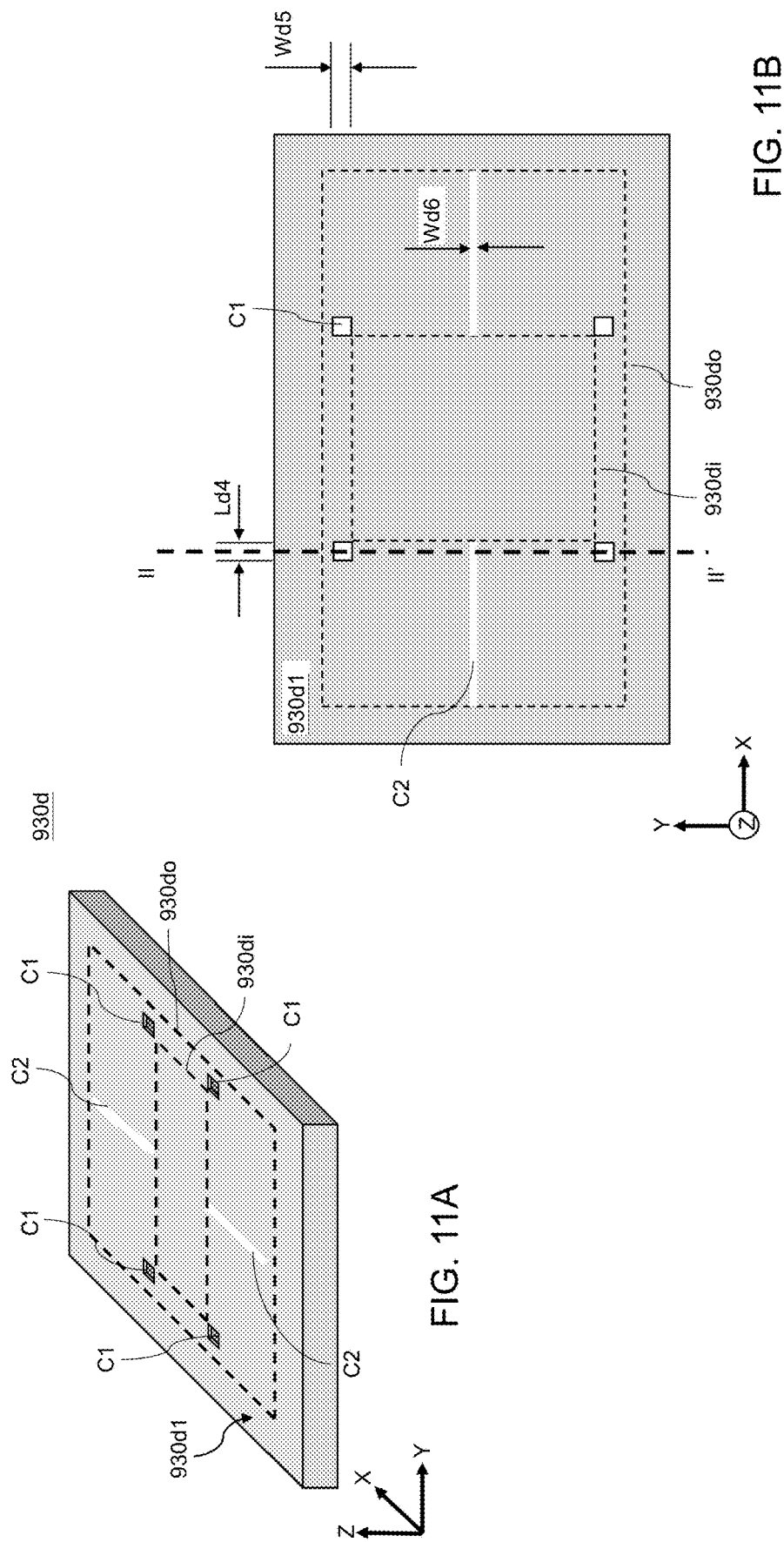

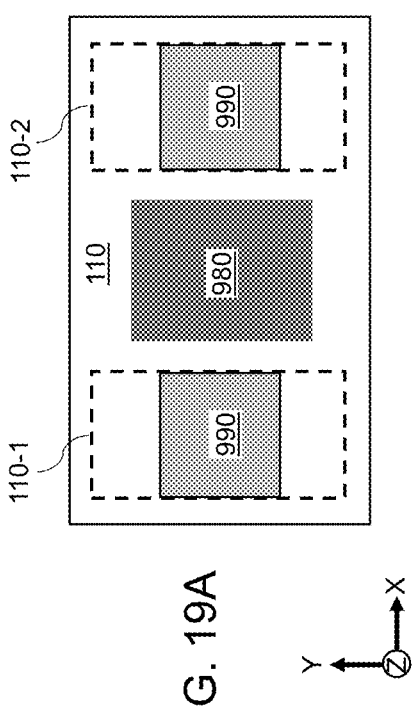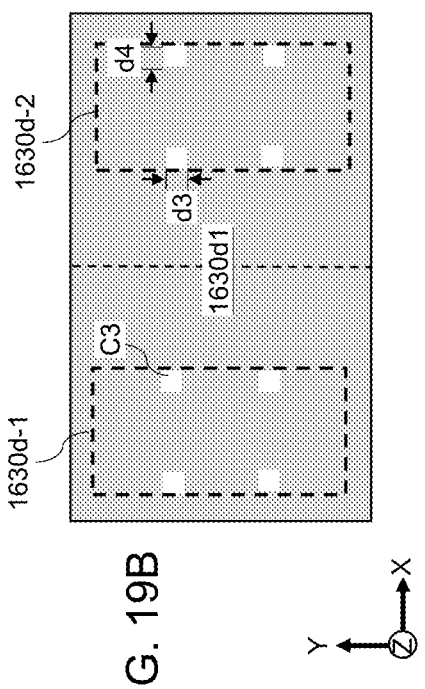

PACKAGE ASSEMBLY INCLUDING LID WITH ADDITIONAL STRESS MITIGATING FEET AND METHODS OF MAKING THE SAME

RELATED APPLICATIONS

This application claims the benefit of priority from U.S. Provisional Application No. 63/222,234, entitled "TIM1 Stress Mitigation Method by Reinforce Embedded Lid Foot Design" filed on Jul. 15, 2021, the entire contents of which are incorporated herein by reference for all purposes.

BACKGROUND

A package assembly may include one or more semiconductor devices (e.g., semiconductor dies, interposer modules, etc.) that may be mounted on a substrate. The package assembly may also include a package lid mounted on the substrate over the semiconductor devices. The package lid may include a foot that may be attached to the substrate by using an adhesive. A thermal interface material (TIM) film may be located between the semiconductor devices and the package lid. Designing the package assembly to avoid cracking and delamination of the TIM film may be challenging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 11A is a perspective view of the plate portion of the package lid, according to one or more embodiments.

FIG. 11B is a plan view of the bottom surface of the plate portion, according to one or more embodiments.

FIG. 19A is a plan view of the package substrate in a third alternative design of the package assembly, according to one or more embodiments FIG. 19B is a plan view of the bottom surface of the plate portion in the third alternative design of the package assembly, according to one or more embodiments.

FIG. 20A is a plan view of the package substrate in a fourth alternative design of the package assembly, according to one or more embodiments.

FIG. 20B is a plan view of the bottom surface of the plate portion in the fourth alternative design of the package assembly, according to one or more embodiments.

DETAILED DESCRIPTION

Figure 1A:
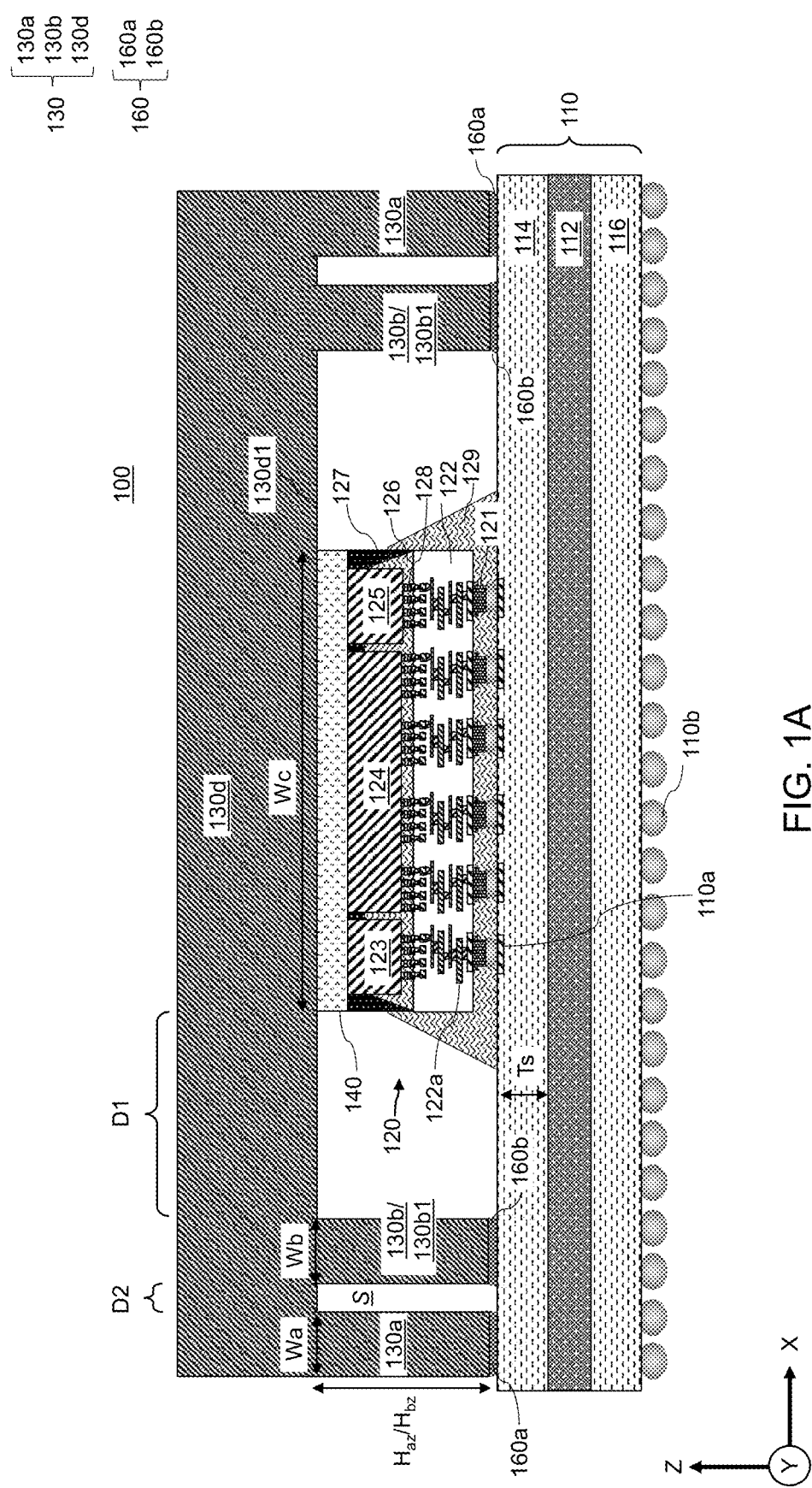
FIG. 1A is a vertical cross-sectional view of a package assembly (e.g., organic/silicon interposer package) according to one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

One or more embodiments may include a thermal interface material film (TIM film) (e.g., TIM1) stress mitigation method by reinforcement with an embedded lid foot design. For high-power integrated circuit production, a metal TIM film may be widely used in industry because of its high thermal conductivity performance. However, a metal TIM film has a potential increase in risk of cracking and delamination as the size is increased (e.g., larger than 10 mm×10 mm).

Typically, a package lid may include only one foot that may be referred to as an outer foot in a ring shape. In one or more embodiments, a package assembly may include a package lid having an outer foot and one or more inner feet. In particular, the package lid may include one or more embedded support feet that may be located in the corners of the package lid, respectively. The package assembly may also include a novel substrate shape to accommodate the lid feet embedded design, and novel adhesive pattern to accommodate the lid feet embedded design.

The embodiments may include several novel and inventive features including, for example, 1) a package lid including a corner-shaped inner foot that may be embedded in the package substrate (e.g., extra support embedded package lid), 2) a number of the inner feet that may be embedded (e.g., multi-embedded support package lids) may be greater than or equal to one, and 3) the package lid (e.g., the package lid with extra support) may avoid touching the passive components (e.g., resisters, capacitors, transformers, etc.).

One or more embodiments may have several advantages and benefits. A stress on the TIM film (e.g., TIM1 stress) may be mitigated so that a metal TIM film (e.g., a solder TIM) may not be restricted to only small chip-on-wafer (CoW) dies. The package lid (e.g., reinforced package lid foot structure) may also mitigate the stress-induced TIM crack and TIM delamination issue and, therefore, improve the reliability of a package assembly.

The package assembly may include a substrate and an interposer module on the substrate. The interposer module may include an organic interposer, a system on chip (SOC) device and high-bandwidth memory (HBM) connected to the organic interposer by a plurality of microbumps, a first underfill formed around the plurality of microbumps, and a molding material formed on the SOC device and HBM device. The package assembly may also include a TIM film on the interposer module, a plurality of C4 bumps for connecting the interposer module to the substrate, a second underfill between the interposer module and substrate, a package lid attached to the substrate over the interposer module, and an adhesive for attaching the package lid to the substrate.

The package lid may include an outer foot having a first height and an inner foot having a second height. The second height may be greater than or equal to the first height. An embedded length of the inner foot may be equal to the difference between the second height and the first height.

On a first side of the package lid, the inner foot may extend over a first distance, and the outer foot may extend over a second distance, and the first distance may be greater than or equal to 10% of the second distance. On a second side of the package assembly that adjoins the first side, the inner foot may also extend over the first distance and the outer foot may extend over the second distance. The package lid may include a standard type in which an inner foot may be formed at a corner of the package lid, a multiple inner feet type (enhanced type-1) in which the inner foot includes line portions formed along a side of the package lid, and a heavy feet type (enhanced type-2) which may be similar to the multiple inner feet type, except that a thickness of the inner foot may be increased.

A length of an embedded portion of the inner foot may be variable. In particular, a package substrate may include a core substrate and an upper insulating layer formed on the core substrate. A difference between the height of the outer foot and the height of the inner foot may be zero (e.g., the height of the inner foot may be equal to the height of the outer foot). The length of the embedded portion of the inner foot may be greater than zero but less than the thickness of the upper insulating layer. That is, a length of the embedded portion of the inner foot (e.g., the supported embedded ring) may be anywhere between zero and the thickness of the upper insulating layer. If the length of the embedded portion exceeds the thickness of the upper insulating layer, it may result in other extra adverse effect on molding and underfill.

The inner foot (e.g., embedded inner foot) may act as a TIM stress reliever. That is, the embedded inner foot may improve the stress mitigation on the TIM film (e.g., TIM1). In particular, the stress on the TIM film with the new designed package lid can be about 15% less than a stress on the TIM film in a conventional package assembly. That is, for example, the novel package lid of the embodiments may reduce the stress from TIM1 stress=1 in a conventional package assembly to TIM1 stress=0.85 in one or more embodiments.

A method of making the package assembly may include, for example, before performing an on-substrate (oS) process, using a laser drilling technique on the package substrate to obtain the defined shape on the package substrate (e.g., to make a hole in the package substrate). In particular, the method may include the steps of 1) providing a substrate, 2) performing a laser drilling process for making a hole to embed the inner foot, 3) flip chip bonding an interposer module onto the package substrate and applying the underfill between the interposer module and package substrate, and 4) attaching the inner foot and outer foot (i.e., attaching the ring) to the package substrate by using an adhesive. The inner foot adhesive used to adhere the inner foot to the package substrate can be, for example, an epoxy adhesive or silicone adhesive. The inner foot adhesive can be the same as or different from the outer foot adhesive.

The package lid may be composed, for example, of polymer, metal or ceramic. In one or more embodiments, Cu/CuS304/SUS430 may be used as a material for the package lid. The package lid may be mold-formed, punched or stamped to have the inner foot and outer foot, or a CNC milling tool may be used to fabricate the package lid including the inner foot and outer foot.

Figure 1C:
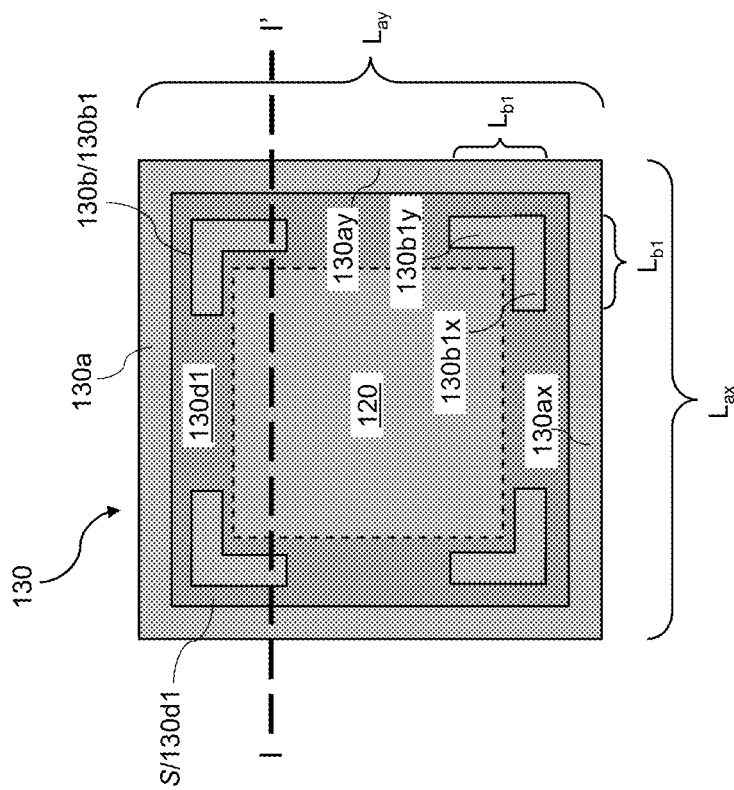
FIG. 1C is a plan view of the bottom surface of the plate portion of the package lid according to one or more embodiments.
Figure 1B:
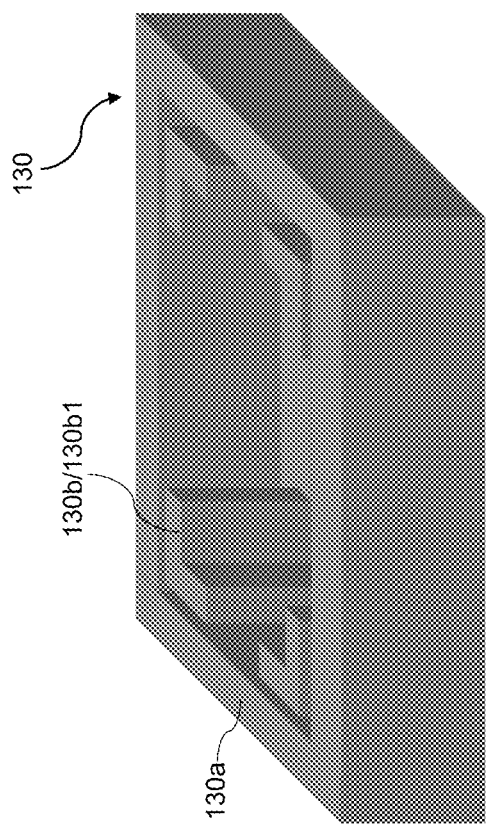
FIG. 1B is a perspective view of a package lid that may be included in the package assembly according to one or more embodiments.

FIG. 1A is a vertical cross-sectional view of a package assembly 100 (e.g., organic/silicon interposer package) according to one or more embodiments. It should be noted that some background elements may be omitted from FIG. 1A for ease of explanation. FIG. 1B is a perspective view of a package lid 130 that may be included in the package assembly 100 according to one or more embodiments. FIG. 1C is a plan view of the bottom surface 130d1 of the plate portion 130d of the package lid 130 according to one or more embodiments. The vertical cross-sectional view of the package assembly 100 in FIG. 1A is a view along the line I-I' in the package lid 130 in FIG. 1C.

As illustrated in FIG. 1A, the package assembly 100 may include a package substrate 110, an interposer module 120 mounted on the package substrate 110, and a package lid 130 on the interposer module 120 and attached to the package substrate 110. The package assembly 100 may also include a TIM film 140 formed on the interposer module 120. The TIM film 140 may include, for example, a metal TIM film (e.g., a solder TIM), a thermal paste, thermal adhesive, thermal gap filler, thermal pad (e.g., silicone), thermal tape, a graphite TIM film, and a carbon nanotube TIM film. Other types of TIM films are within the contemplated scope of this disclosure.

The package substrate 110 may include any substrate that can support a package assembly including, for example, a system on integrated substrate (SoIS), a printed circuit board (PCB) etc. In one or more embodiments, the package substrate 110 may include a core substrate 112 (e.g., polymer substrate), an upper insulating layer 114 (e.g., chip-side insulating layer) having a thickness $T_s$ formed on the core substrate 112, and a lower insulating layer 116 (e.g., board-side insulating layer) formed in contact with the core substrate 112 opposite the upper insulating layer 114. The package substrate 110 may also include metal interconnects and through vias to provide an electrical connection of the package substrate 110.

The package substrate 110 may also include metal bonding pads 110a formed on a chip-side of the package substrate 110, for providing an electrical connection to a semiconductor device (e.g., interposer module, semiconductor die, etc.) that is mounted on the package substrate 110. A ball-grid array (BGA) including a plurality of solder balls 110b may be formed on a board-side of the package substrate 110 that is opposite to the chip-side of the package substrate 110. The solder balls 110b may allow the package assembly 100 to be securely mounted on a substrate such as a printed circuit board (PCB) and electrically coupled to the substrate. The solder balls 110b may be electrically connected to the metal bonding pads 110a by the metal interconnects and through vias in the package substrate 110.

The interposer module 120 may be mounted by C4 bumps 121 on the metal bonding pads 110a in the package substrate 110. Although only one interposer module 120 is illustrated in FIG. 1A, the package assembly 120 may include more than one interposer module 120. The interposer module 120 may include an interposer dielectric layer 122 that may embed metal interconnects 122a connected to the C4 bumps 121. The interposer module 120 may also include a first semiconductor die 123, second semiconductor die 124 and a third semiconductor die 125 that may all be mounted on the interposer dielectric layer 122. While the embodiment illustrated in FIG. 1A includes a first semiconductor die 123, second semiconductor die 124 and a third semiconductor die 125, in other embodiments the interposer module 120 may include fewer or more semiconductor dies.

The first semiconductor die 123, second semiconductor die 124 and third semiconductor die 125 may be mounted on the interposer dielectric layer 122 by micro-bumps 128 that may be electrically connected to the metal interconnects 122a. A package underfill layer 129 may be formed under and around the interposer module 120 and the C4 bumps 121 so as to adhere the interposer module 120 to the package substrate 110. The package underfill layer 129 may be formed of an epoxy-based polymeric material.

Each of the first semiconductor die 123, second semiconductor die 124 and third semiconductor die 125 may include, for example, a semiconductor die, a system on chip (SOC) die, a system on integrated chips (SoIC) die, and a high-bandwidth memory (HBM) die. In particular, the interposer module 120 may include a high-performance computing (HPC) application and may include, for example, an integrated graphics processing unit (GPU), application specific integrated circuit (ASIC), field-programmable gate array (FPGA), and HBM by chip on wafer on substrate (CoWoS) technology or integrated fan-out on substrate (INFO-oS) technology.

An interposer underfill layer 126 may be formed around the micro-bumps 128 and between the first semiconductor die 123 and the interposer dielectric layer 122, between the second semiconductor die 124 and the interposer dielectric layer 122, and between the third semiconductor die 125 and the interposer dielectric layer 122. The interposer underfill layer 126 may be formed continuously as one layer under the first semiconductor die 123, second semiconductor die 124 and third semiconductor die 125, as illustrated in FIG. 1A. Alternatively, the interposer underfill layer 126 may be formed as three separate layers under the first semiconductor die 123, second semiconductor die 124 and third semiconductor die 125, respectively. The interposer underfill layer 126 may also be formed between first semiconductor die 123 and the second semiconductor die 124, and between the second semiconductor die 124 and the third semiconductor die 125. The interposer underfill layer 126 may also be formed of an epoxy-based polymeric material.

A molding material layer 127 may be formed over the first semiconductor die 123, the second semiconductor die 124, the third semiconductor die 125, the interposer underfill layer 126 and the interposer dielectric layer 122. The molding material layer 127 may be formed of an epoxy molding compound (EMC).

The TIM film 140 may be formed on the interposer module 120 to dissipate of heat generated during operation of the package assembly 100 (e.g., operation of first semiconductor die 123, second semiconductor die 124, and third semiconductor die). The TIM film 140 may include, for example, a metal TIM film that may be attached to the interposer module 120, for example, by a thermally conductive adhesive. In particular, the TIM film 140 may contact an upper surface of first semiconductor die 123, an upper surface of second semiconductor die 124, an upper surface of the third semiconductor die 125, and an upper surface of the molding material layer 127. The TIM film 140 may have a low bulk thermal impedance and high thermal conductivity. The bond-line-thickness (BLT) (e.g., a distance between the package lid 130 and the interposer module 120) may be less than about 100 μm, although greater or lesser distances may be used.

The package assembly 100 may also include a stiffener ring (not shown) that may be adhered to the package substrate 110 by an adhesive (e.g., a silicone adhesive or an epoxy adhesive). The stiffener ring may be formed of a metal such as copper with a nickel coating, or an aluminum alloy. The stiffener ring may be formed on the package substrate 110 so as to surround the interposer module 120. The stiffener ring may increase the rigidity to the package substrate 110.

The package lid 130 may be on the TIM film 140 and may provide a cover for the interposer module 120. The package lid 130 may contact at least a portion of the TIM film 140. In one or more embodiments, the package lid 130 may directly contact an entire upper surface of the TIM film 140. The package lid 130 may be formed, for example, of metal, ceramic or polymer material. The package lid 130 may include a plate portion 130d that may cover the interposer module 120. The plate portion 130d may include a central region that is formed over a central portion of the interposer module 120. A bottom surface 130d1 of the plate portion 130d may extend across most of the plate portion 130d and contact the TIM film 140.

The package lid 130 may also include an outer foot 130a and inner foot 130b that may both extend from the plate portion 130d (e.g., in the z direction in FIG. 1A) and connect the package lid 130 to the package substrate 110 by an adhesive 160. That is, the adhesive 160 may adhere the outer foot 130a to the package substrate 110 and the inner foot 130b to the package substrate 110.

The inner foot 130b may extend from the plate portion 130d within a perimeter established by the outer foot 130a. The inner foot 130b may be separately formed from the outer foot 130a. In particular, the inner foot 130b may extend from the plate potion 130d separately from the outer foot 130a so that a space S may be formed between the inner foot 130b and the outer foot 130a. A distance D1 (e.g., in the x-direction in FIG. 1A) between the inner foot 130b and the TIM film 140 (e.g., between the inner foot 130b and the interposer module 120) may be greater than about 1000 μm. A distance D2 between the inner foot 130b and the outer foot 130a (e.g., a width of the space S) may generally be in a range from about 0.2 mm to about 10 mm. In one or more embodiments, the distance D2 may be in a range from about 0.5 mm (500 μm) to about 10 mm. A distance D3 between the outer foot 130a and the TIM film 140 (e.g., between the outer foot 130a and the interposer module 120) may be greater than about 1500 μm. The distances D1, D2 and D3 may depend upon several factors such as a width (in the x-direction in FIG. 1A) of the plate portion 130d, a width Wb of the inner foot 130b, a width Wa of the outer foot 130a, a width Wc of the interposer module 120 (e.g., a width of the TIM film), etc.

The inner foot 130b may have a width Wb that is greater than or equal to a width Wa of the outer foot 130a. In particular, the outer foot 130a may have a width Wa in a range from about 0.5 mm to about 6 mm, and the inner foot 130b may have a width Wb in a range from about 1 mm to about 10 mm. The inner foot 130b may have a height $H_{bz}$ from the bottom surface 130d1 of the plate portion 130d that is substantially the same as a height $H_{az}$ of the outer foot 130a. That is, the outer foot 130a may extend from the plate portion 130d by a first distance (i.e., $H_{az}$), and the inner foot 130b may extend from the plate portion 130d by a second distance (i.e., $H_{bz}$) substantially the same as the first distance. The inner foot 130b may be formed on the package lid 130, for example, by milling using a computer numerical control (CNC) milling machine, or by molding, punching or stamping the package lid 130 to include the inner foot 130b.

The adhesive 160 may include, for example, epoxy adhesive or silicone adhesive. Other adhesives are within the contemplated scope of this disclosure. The adhesive 160 may include an adhesive outer portion 160a that adheres the outer foot 130a to the package substrate 110, and an adhesive inner portion 160b that adheres the inner foot 130b to the package substrate 110. The adhesive outer portion 160a may be composed of the same adhesive material as the adhesive inner portion 160b. Alternatively, the adhesive outer portion 160a may be composed of an adhesive material that is different than that the adhesive inner portion 160b. The adhesive outer portion 160a may have a first thickness at the outer foot 130a, and the adhesive inner portion 160b may have a second thickness at the inner foot 130b, and the second thickness may be substantially the same as than the first thickness.

The adhesive outer portion 160a may have a shape (in a plan view) that corresponds to a shape of the outer foot 130a, and the adhesive inner portion 160b may have a shape (in a plan view) that corresponds to a shape of the inner foot 130b. A width of the adhesive outer portion 160a may be substantially the same as the width Wa of the outer foot 130a, and a width of the adhesive inner portion 160b may be substantially the same as the width Wb of the inner foot 130b. That is, the adhesive outer portion 160a may adhere to substantially all of the bottom surface of the outer foot 130a, and the adhesive inner portion 160b may adhere to substantially all of the bottom surface of the inner foot 130b. In particular, an outermost edge and innermost edge of the adhesive outer portion 160a may be substantially aligned with an outermost edge and innermost edge of the bottom of the outer foot 130a, respectively, and an outermost edge and innermost edge of the adhesive inner portion 160b may be substantially aligned with an outermost edge and innermost edge of the bottom of the inner foot 130a, respectively.

As illustrated in FIGS. 1B and 1C, the package lid 130 may have a square shape or rectangle shape. Other suitable shapes of the package lid 130 may be within the contemplated scope of disclosure. The outer foot 130a may be formed continuously around the entire perimeter of the bottom surface 130d1 of the plate portion 130d. The inner foot 130b may include one or more inner foot corner portions 130b1 having a corner shape or L-shape. The inner foot corner portions 130b1 may be located between the outer foot 130a and the interposer module 120 in the x-direction and the y-direction in FIG. 1A. It should be noted that only the part of the inner foot corner portion 130b1 that extends in the y-direction is illustrated in the vertical cross-sectional view of FIG. 1A, and the lid is not limited thereto. The inner foot corner portion 130b1 may be formed inside each corner of the outer foot 130a, and may be substantially aligned with the corresponding corner of the outer foot 130a.

The bottom surface 130d1 of the plate portion 130d may be bounded on all sides by the outer foot 130a and may therefore, have a shape that corresponds to (e.g., is substantially the same as) the shape of the outer foot 130a (i.e., a square shape as shown in FIG. 1C). The outer foot 130a may include a first outer foot side 130ax and a second outer foot side 130ay. The inner foot corner portion 130b1 may include a first inner foot corner portion side 130b1x extending along the first outer foot side 130ax. The first inner foot corner portion side 130b1x may have a length $L_{b1}$ that is less than a length $L_{ax}$ of the first outer foot side 130ax. The inner foot corner portion 130b1 may also include a second inner foot corner portion side 130b1y extending along the second outer foot side 130ay. The second inner foot corner portion side 130b1y may have a length $L_{b1}$ that is less than a length $L_{ay}$ of the second outer foot side 130ay. In particular, the length $L_{b1}$ of the first inner foot corner portion side 130b1x may be greater than or equal to 0.1 times the length $L_{ax}$ of the first outer foot side 130ax. The length $L_{b1}$ of the second inner foot corner portion side 130b1y may be greater than or equal to 0.1 times the length $L_{ay}$ of the second outer foot side 130ay.

There may be several advantages provided by the inner foot 130b of the package lid 130. The inner foot 130b may improve (e.g., strengthen) the bond between the package lid 130 and the package substrate 110, as compared to conventional package assemblies. This improved bond may the reduce the risk of delamination of the adhesive 160 from the package substrate 110. The improved bond may act to reduce a stress (e.g., TIM1 stress) on the TIM film 140. That is, the inner foot 130b may act as stress buffer in the package assembly 100. In particular, the stress on the TIM film 140 with the new designed package lid 130 can be about 15% less than a stress on the TIM film in a conventional package assembly. That is, the novel package lid 130 may reduce the stress from TIM1 stress=1 in a conventional package assembly to TIM1 stress=0.85 in one or more embodiments.

By reducing the stress on the TIM film 140, the package lid 130 with the reinforced package lid foot structure design may also mitigate the stress-induced crack in the TIM film 140 and delamination of the TIM film 140. The package lid 130 may, therefore, improve the reliability performance of the package assembly 100.

It should also be noted that the inner foot 130b may be added to the package lid 130 without requiring the purchase of new tooling. Therefore, there may be almost no cost added by the addition of the inner foot 130b. Further, because of the reduced risk of cracking and delamination of TIM film provided by the inner foot 130b in the new package lid design, a metal TIM film can now be used in large COW dies (e.g., ≥10×10 mm) without the risk of cracking and delamination.

Figure 1D:
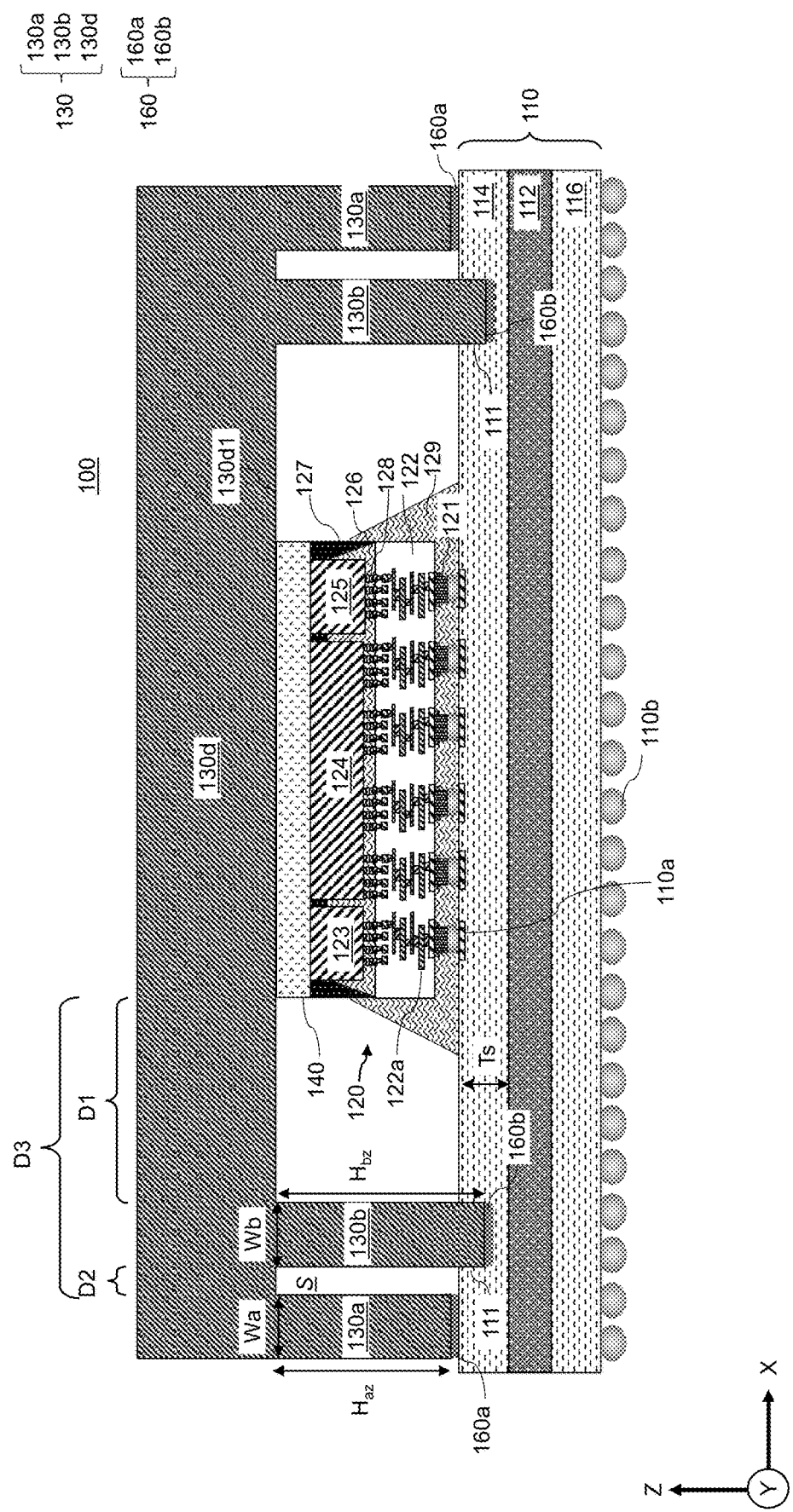
FIG. 1D is a vertical cross-sectional view of a package assembly (e.g., organic/silicon interposer package) according to one or more embodiments.

FIG. 1D is a vertical cross-sectional view of the package assembly 100 having an alternative design, according to one or more embodiments. As illustrated in FIG. 1D, the upper insulating layer 114 may include a recessed portion 111 (e.g., a trench). A shape and location (in a plan view) of the recessed portion 111 may correspond to the shape and location of the inner foot 130b. A width of the recessed portion 111 may be slightly greater than a width Wb of the inner foot 130b. In at least one embodiment, the width of the recessed portion 111 may be greater than the width Wb of the inner foot 130b by more than 1 μm. A depth of the recessed portion 111 may be less than the thickness $T_s$ of the upper insulating layer 114 (e.g., about one half the thickness $T_s$ of the upper insulating layer 114) so that a bottom of the recessed portion 111 may be formed within the upper insulating layer 114.

The height $H_{bz}$ of the inner foot 130b may be greater than a height $H_{az}$ of the outer foot 130a. That is, the outer foot 130a may extend from the plate portion 130d by a first distance (i.e., $H_{az}$), and the inner foot 130b may extend from the plate portion 130d by a second distance (i.e., $H_{bz}$) that is greater than the first distance (i.e., $H_{az}$). A difference between the first distance and the second distance may be, for example, in a range of 100 μm to 500 μm. The difference between the first distance and the second distance may also constitute the embedded length of the inner foot 130b (e.g., the length of the inner foot 130b that is embedded in the upper insulating layer 114. The length of the embedded portion of the inner foot may be greater than zero but less than a thickness $T_s$ of the upper insulating layer. That is, a length of the embedded portion of the inner foot (e.g., the supported embedded ring) may be anywhere between zero and $T_s$.

The adhesive inner portion 160b may be placed at the bottom of the recessed portion 111, and the inner foot 130b may be inserted into recessed portion 111 and adhered inside the recessed portion 111 by the adhesive inner portion 160b.

Figure 1E:
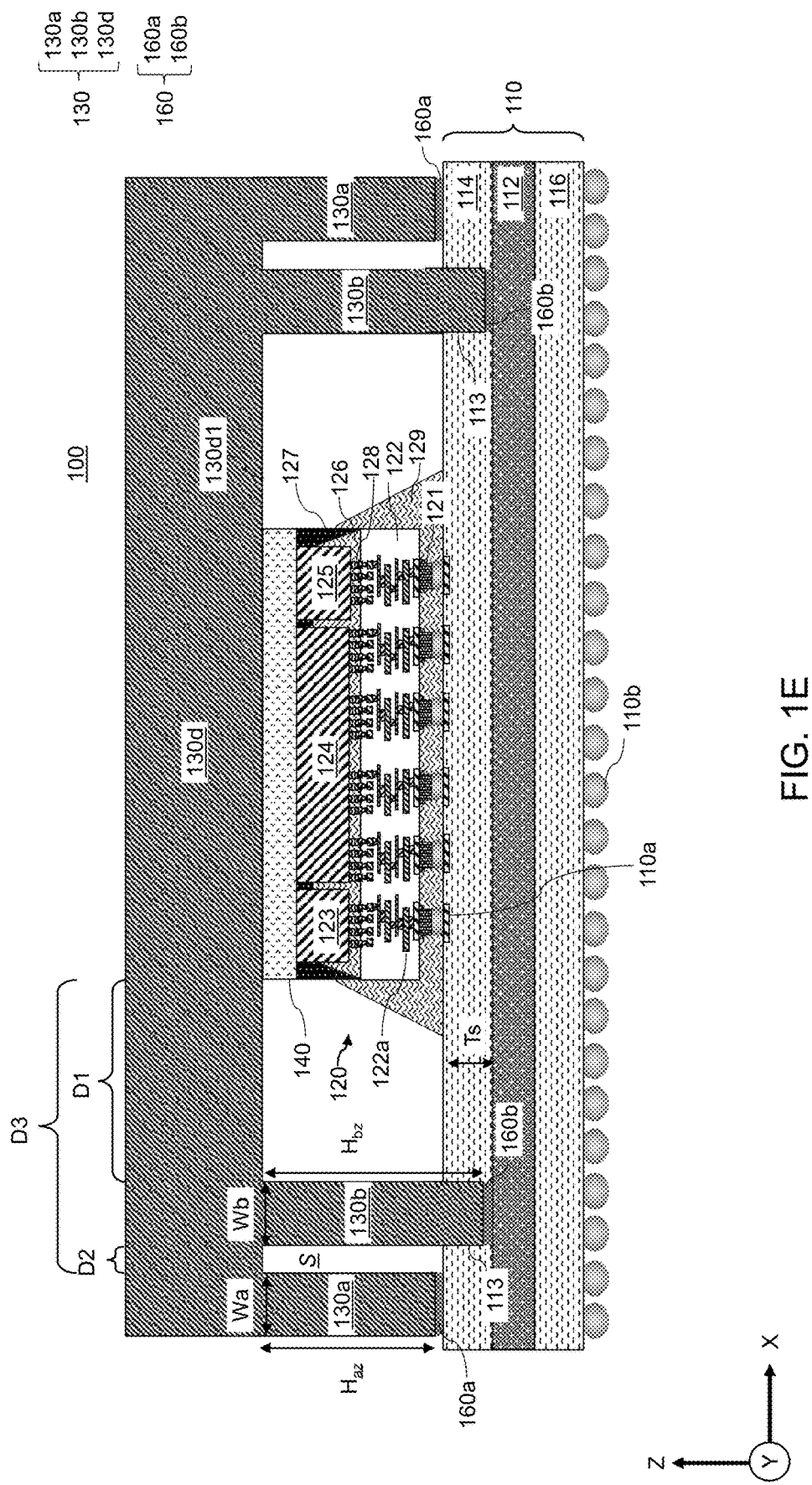
FIG. 1E is a vertical cross-sectional view of a package assembly (e.g., organic/silicon interposer package) according to one or more embodiments.

FIG. 1E is a vertical cross-sectional view of the package assembly 100 having an another alternative design, according to one or more embodiments. As illustrated in FIG. 1E, the upper insulating layer 114 may include a recessed portion 113 (e.g., a trench). A shape and location (in a plan view) of the recessed portion 113 may correspond to the shape and location of the inner foot 130b (e.g., see FIG. 1C). A width of the recessed portion 113 may be slightly greater than a width Wb of the inner foot 130b. A depth of the recessed portion 113 may be substantially the same as a thickness $T_s$ of the upper insulating layer 114, so that a bottom of the recessed portion 113 may be formed on an upper surface of the core substrate 112.

The height $H_{bz}$ of the inner foot 130b may be greater than a height $H_{az}$ of the outer foot 130a. That is, the outer foot 130a may extend from the plate portion 130d by a first distance (i.e., $H_{az}$), and the inner foot 130b may extend from the plate potion 130d by a second distance (i.e., $H_{bz}$) that is greater than the first distance (i.e., $H_{az}$). A difference between the first distance and the second distance may be, for example, in a range of 500 μm to 1000 μm. The difference between the first distance and the second distance may also constitute the embedded length of the inner foot 130b (e.g., the length of the inner foot 130b that is embedded in the upper insulating layer 114).

The adhesive inner portion 160b may be placed at the bottom of the recessed portion 113, and the inner foot 130b may be inserted into recessed portion 113 and adhered inside the recessed portion 113 by the adhesive inner portion 160b.

Figure 2B:
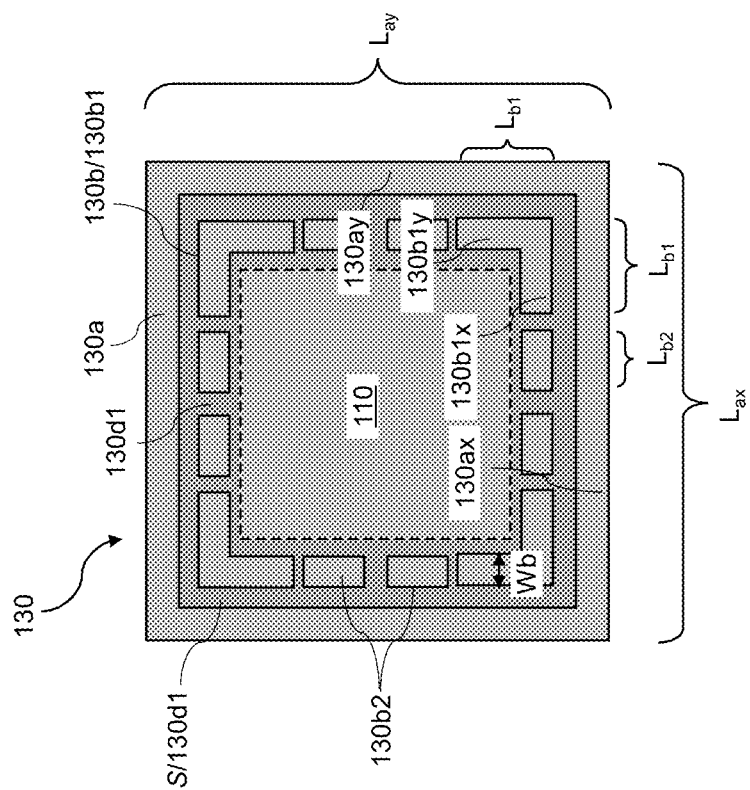
FIG. 2B is a plan view of the bottom surface of the plate portion of the package lid according to one or more embodiments.
Figure 2A:
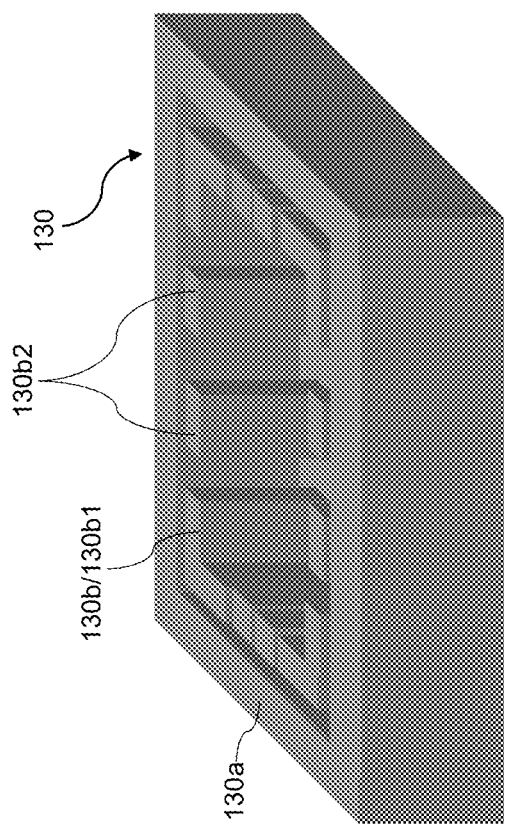
FIG. 2A is a perspective view of a package lid that may be included in the package assembly according to one or more embodiments.

FIGS. 2A-2B illustrate an alternative design in which package lid 130 includes inner foot line portions 130b2. FIG. 2A is a perspective view of the package lid 130 having the alternative design according to one or more embodiments. FIG. 2B is a plan view of the bottom surface 130d1 of the plate portion 130d of the package lid 130 having the alternative design according to one or more embodiments.

As illustrated in FIGS. 2A and 2B, in this alternative design, the inner foot 130b may include the inner foot corner portions 130b1 having a corner shape or L-shape. The inner foot 130b may also include one or more inner foot line portions 130b2 placed along a side of the package lid 130 between opposing inner foot corner portions 130b1. Although two inner foot line portions 130b2 are illustrated in FIGS. 2A and 2B, other numbers of inner foot line portions 130b2 are contemplated by the embodiments.

As illustrated in FIG. 2B, the inner foot line portions 130b2 may be aligned with the opposing inner foot corner portions 130b1. The inner foot line portions 130b2 may have a height (e.g., extending from the plate portion 130d) and width that are substantially the same as the height $H_{bz}$ and width Wb of the inner foot corner portions 130b1, respectively. The inner foot line portions 130b2 may be uniformly spaced between the opposing inner foot corner portions 130b1. The inner foot line portions 130b2 may have a length Lb2 that is less than a length $L_{b1}$ of the first inner foot corner portion side 130b1x and second inner foot corner portion side 130b1y. The length Lb2 and width of the inner foot line portions 130b2 may be uniform along one side of the package lid 130, and may also be uniform around an entire perimeter of the package lid 130.

The alternative design of the package lid 130 illustrated in FIGS. 2A-2B may be implemented in any of the designs of the package assembly 100 illustrated in FIGS. 1A, 1D and 1E. That is, the inner foot 130b in FIGS. 2A-2B may have a height $H_{bz}$ that is substantially equal to the height $H_{az}$ of the outer foot 130a (e.g., see FIG. 1A). The inner foot 130b in FIGS. 2A-2B may alternatively have an embedded portion having a length that is less than the thickness $T_s$ of the upper insulating layer 114 (e.g., see FIG. 1D), or an embedded portion having a length that is substantially equal to the thickness $T_s$ of the upper insulating layer 114 (e.g., FIG. 1E).

Figure 3B:
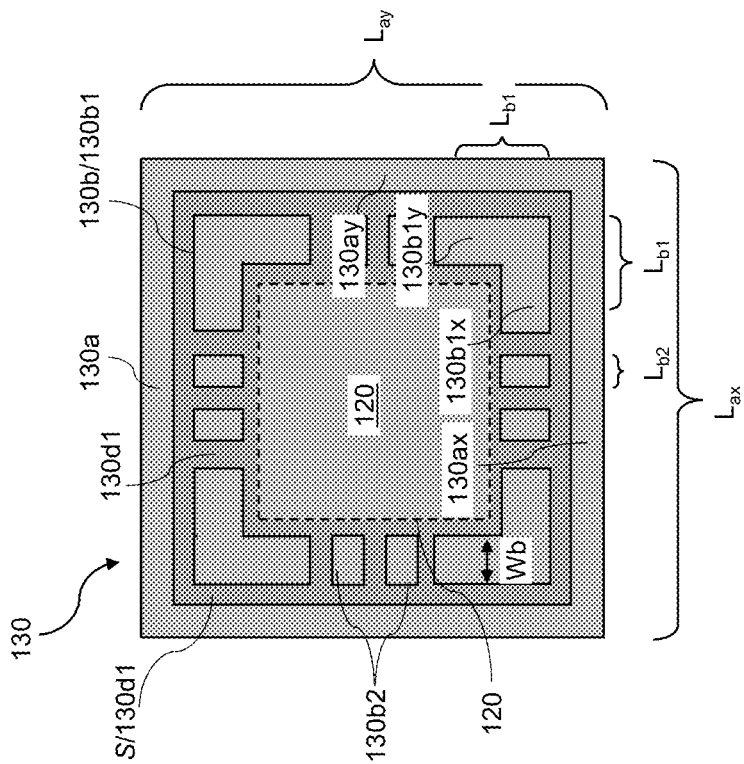
FIG. 3B is a plan view of the bottom surface of the plate portion of the package lid according to one or more embodiments.
Figure 3A:
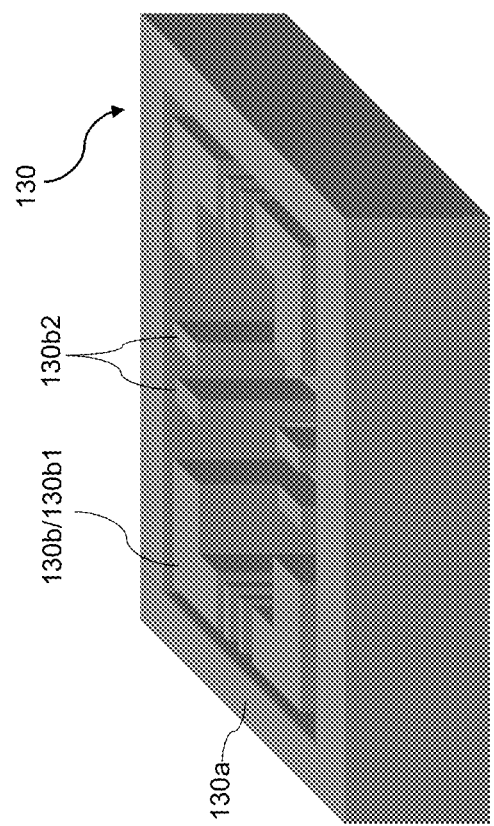
FIG. 3A is a perspective view of a package lid that may be included in the package assembly according to one or more embodiments.

FIGS. 3A-3B illustrate another alternative design in which package lid 130 is similar to that in FIGS. 2A-2B, but is further enhanced by having an increased width Wb of the inner foot 130b. Unlike the design of FIGS. 2A-2B in which the width Wb of the inner foot 130b may be in a range from 1 mm to about 10 mm, in the design of FIGS. 3A-3B, the inner foot 130b may have a width Wb in a range from about 2 mm to about 10 mm. In addition, unlike the design of FIGS. 2A-2B in which the width Wb of the inner foot 130b may be the same as the width Wa of the outer foot 130a, in the design of FIGS. 3A-3B, the width Wb of the inner foot 130b may be substantially greater than (e.g., at least 50% greater than) the width Wa of the outer foot 130a.

As illustrated in FIGS. 3A and 3B, in this alternative design, the inner foot 130b may include the inner foot corner portions 130b1 having a corner shape or L-shape. The inner foot 130b may also include one or more inner foot line portions 130b2 placed along a side of the package lid 130 between opposing inner foot corner portions 130b1. Although two inner foot line portions 130b2 are illustrated in FIGS. 3A and 3B, other numbers of inner foot line portions 130b2 are contemplated by the embodiments.

As illustrated in FIG. 3B, the inner foot line portions 130b2 may be aligned with the opposing inner foot corner portions 130b1. The inner foot line portions 130b2 may have a height (e.g., extending from the plate portion 130d) and width that are substantially the same as the height $H_{bz}$ and width Wb of the inner foot corner portions 130b1, respectively. The inner foot line portions 130b2 may be uniformly spaced between the opposing inner foot corner portions 130b1. The inner foot line portions 130b2 may have a length Lb2 that is less than a length $L_{b1}$ of the first inner foot corner portion side 130b1x and second inner foot corner portion side 130b1y. The length Lb2 and width of the inner foot line portions 130b2 may be uniform along one side of the package lid 130, and may also be uniform around an entire perimeter of the package lid 130.

The alternative design of the package lid 130 illustrated in FIGS. 3A-3B may be implemented in any of the designs of the package assembly 100 illustrated in FIGS. 1A, 1D and 1E. That is, the inner foot 130b in FIGS. 3A-3B may have a height $H_{bz}$ that is substantially equal to the height $H_{az}$ of the outer foot 130a (e.g., see FIG. 1A). The inner foot 130b in FIGS. 3A-3B may alternatively have an embedded portion having a length that is less than the thickness $T_s$ of the upper insulating layer 114 (e.g., see FIG. 1D), or an embedded portion having a length that is substantially equal to the thickness $T_s$ of the upper insulating layer 114 (e.g., FIG. 1E).

Figure 4B:
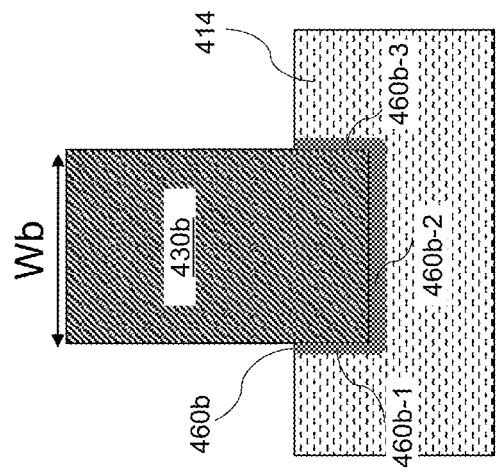
FIGS. 4A and 4B illustrate a recessed portion for a package assembly according to one or more embodiments.
Figure 4A:
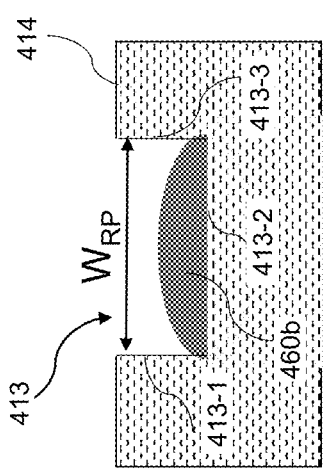

FIGS. 4A-4B illustrate a recessed portion 413 for a package assembly according to one or more embodiments. The description of FIGS. 4A-4B may be applied to any of the recessed portions in the package assemblies described herein.

As illustrated in FIGS. 4A-4B, the recessed portion 413 (e.g., trench) may be formed in an upper insulating layer 414 of a package substrate. A width WRP of the recessed portion 413 may be greater than a width Wb of an inner foot 430b to be inserted in the recessed portion 413. In particular, the width WRP of the recessed portion 413 may be at least 10% greater than the width Wb of an inner foot 430b.

An adhesive inner portion 460b may be dispensed onto the bottom 413-2 of the recessed portion 413, and the inner foot 430b may be inserted into recessed portion 413 and adhered inside the recessed portion 413 by the adhesive inner portion 460b. The amount of adhesive inner portion 460b should be sufficient to fill the recessed portion 413 upon the insertion of the inner foot 430b. The adhesive inner portion 460b may be contained within the recessed portion 413 upon insertion of the inner foot 430b. A height of an upper surface of the adhesive inner portion 460b may be less than or equal to a height of an upper surface of the upper insulating layer 414.

The adhesive inner portion 460b may be formed on a first sidewall 413-1, bottom 413-2 and second sidewall 413-3 of the recessed portion 413. In particular, the adhesive inner portion 460b may include a first portion 460b-1, second portion 460b-2 and third portion 460b-3 that are formed between the inner foot 430b and the first sidewall 413-1, bottom 413-2 and second sidewall 413-3, respectively. Thus, the inner foot 430b may include an embedded portion that is embedded in the upper insulating layer 414 and adhered by the adhesive inner portion 460b to the first sidewall 413-1, bottom 413-2 and second sidewall 413-3 of the recessed portion 413.

Figure 5B:
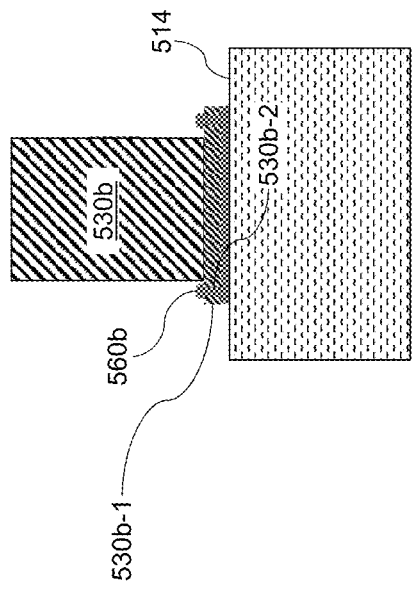
FIG. 5B is a vertical cross-sectional view of the inner foot according to one or more embodiments.
Figure 5A:
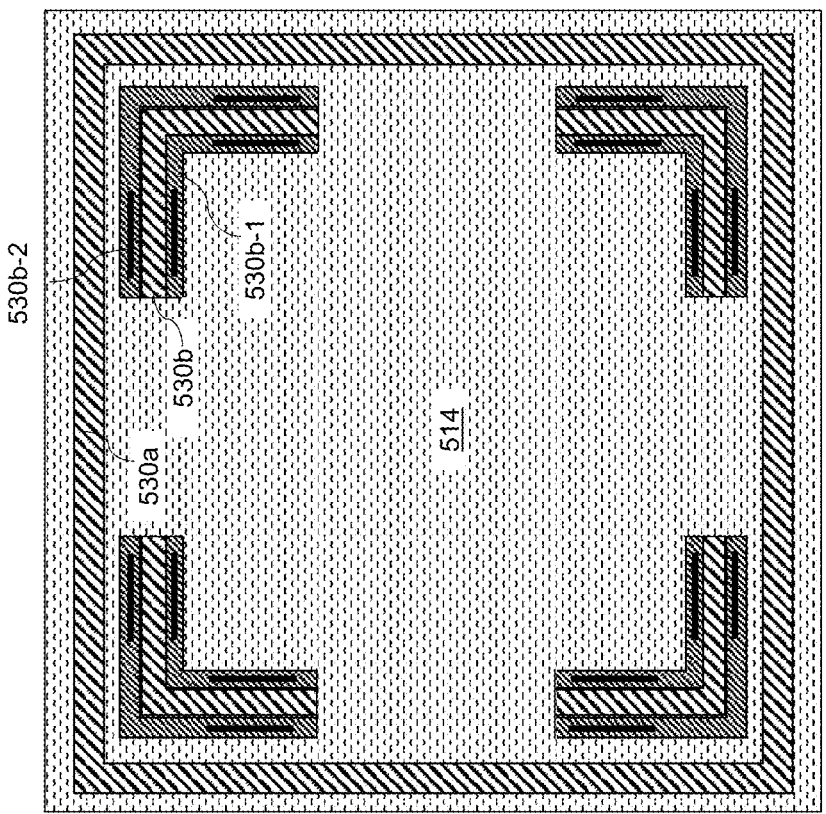
FIG. 5A illustrates a plan view of the inner foot on the upper insulating layer of a package substrate according to one or more embodiments.

FIGS. 5A-5B illustrate an inner foot 530b for a package assembly according to one or more embodiments. FIG. 5A illustrates a plan view of the inner foot 530b on the upper insulating layer 514 of a package substrate according to one or more embodiments. FIG. 5B is a vertical cross-sectional view of the inner foot 530b according to one or more embodiments. The description of FIGS. 5A-5B may be applied to any of the inner feet of the package assemblies described herein.

As illustrated in FIGS. 5A-5B, the inner foot 530b may be located on the upper insulating layer 514 inside the outer foot 530a. The inner foot 530b may include an inner foot flange portion 530b-1 that projects from the inner foot 530b at a bottom end of the inner foot 530b. The inner foot flange portion 530b-1 may from an inner surface of the inner foot 530b toward an inside of the package assembly and/or from an outer surface of the inner foot 530b toward an outside of the package assembly The inner foot flange portion 530b-1 may increase the area of the bottom of the inner foot 530b that contacts a surface to which the inner foot 530b may be bonded. The inner foot 530b including the inner foot flange portion 530b-1 may be bonded to an upper surface of the upper insulating layer 514, to a bottom surface of a recessed portion in the upper insulating layer 514, to an upper surface of a core substrate underlying the upper insulating layer 514, etc.

The inner foot flange portion 530b-1 may also include vertical slits 530b-2 (e.g., through holes) that penetrate the inner foot flange portion 530b-1. As the inner foot 530b is pressed onto the upper insulating layer 514, an adhesive inner portion 560b may be forced into the vertical slits 530b-2 to form an additional bonded interface between inner foot 530b and the upper insulating layer 514.

Figure 6B:
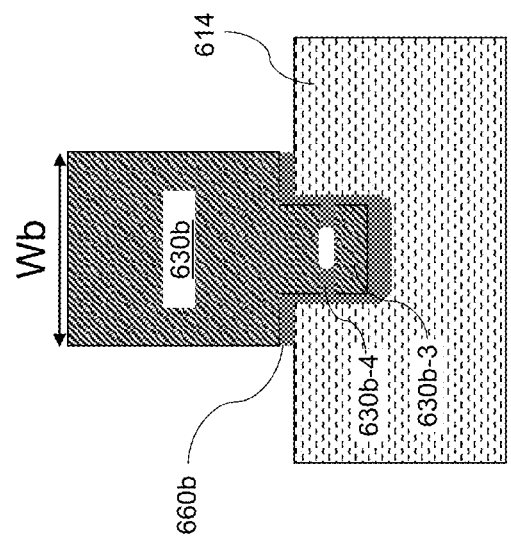
FIG. 6B is a vertical cross-sectional view of the inner foot according to one or more embodiments.
Figure 6A:
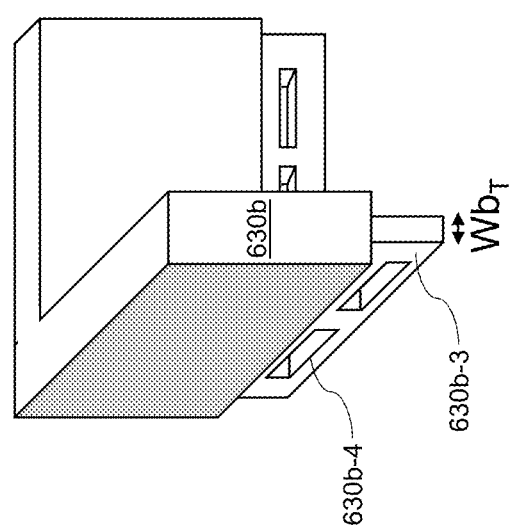
FIG. 6A illustrates a perspective view of the inner foot according to one or more embodiments.

FIGS. 6A-6B illustrate an inner foot 630b for a package assembly according to one or more embodiments. FIG. 6A illustrates a perspective view of the inner foot 630b according to one or more embodiments. FIG. 6B is a vertical cross-sectional view of the inner foot 630b according to one or more embodiments. The description of FIGS. 6A-6B may be applied to any of the inner feet of the package assemblies described herein.

The inner foot 630b may include an inner foot thinned portion 630b-3 that projects downward from a bottom surface of the inner foot 630b. The inner foot thinned portion 630b-3 may have a width WbT that is less than a width Wb of the inner foot 630b. A center of the inner foot thinned portion 630b-3 may be aligned with a center of the inner foot 630b.

The inner foot thinned portion 630b-3 may increase the area of the bottom of the inner foot 630b that contacts a surface to which the inner foot 630b may be bonded. The inner foot thinned portion 630b-3 may be inserted into a recessed portion of an upper insulating layer 614 of a package substrate, and bonded by an adhesive inner portion 660b to a bottom surface and sidewalls of the recessed portion. In addition, upon insertion of the inner foot thinned portion 630b-3 into the recessed portion, the adhesive inner portion 660b may be forced out of the recessed portion and between a bottom surface of the inner foot 630b and an upper surface of the upper insulating layer 614, so that the bottom surface of the inner foot 630b may be bonded to the upper surface of the upper insulating layer 614.

The inner foot thinned portion 630b-3 may also include slits 630b-4 (e.g., through holes) that may penetrate the inner foot thinned portion 630b-3. The slits 630b-4 may be formed horizontally or may be formed at an angle (e.g., angled up and inward toward a center of the inner foot 630b) in a side of the inner foot thinned portion 630b-3. As the inner foot thinned portion 630b-3 is pressed into the recessed portion, the adhesive inner portion 660b may be forced into the slits 630b-4 to form an additional bonded interface between inner foot 630b and the upper insulating layer 614.

FIGS. 7A-7K illustrate various intermediate structures that may be formed during a method of making the package assembly 100 according to one or more embodiments. The method in FIGS. 7A-7K may be used to form all of the alternative designs of the package assembly 100 described above FIG. 7A illustrates a vertical cross-sectional view of an intermediate structure in which the recessed portion 113 may be formed in the upper insulating layer 114 of the package substrate 110 according to one or more embodiments. The recessed portion 113 may be formed, for example, by a laser using a laser drilling process. The recessed portion 113 may be formed by the laser to have a width that is slightly greater than a width of the inner foot 130 that is to be inserted into the recessed portion 113. Alternatively, the recessed portion 113 may be formed to have a width that is at least 10% greater than the width of an inner foot 130b, so that upon insertion of the inner foot 130b into the recessed portion 113, the adhesive 160b may be forced between a sidewall of the recessed portion 113 and the inner foot 130b.

The recessed portion 113 may be formed by the laser to have a depth that is substantially the same as a thickness of the upper insulating layer 114. That is, a bottom of the recessed portion 113 may be constituted by the upper surface of the core substrate 112 of the package substrate 110.

A recessed portion having a shallower depth may be formed in the upper insulating layer 114. For package assemblies that do not mount an inner foot in a recessed portion of the package substrate (e.g., see FIG. 1A), the step of forming the recessed portion illustrated in FIG. 7A may be omitted.

Figure 7A:
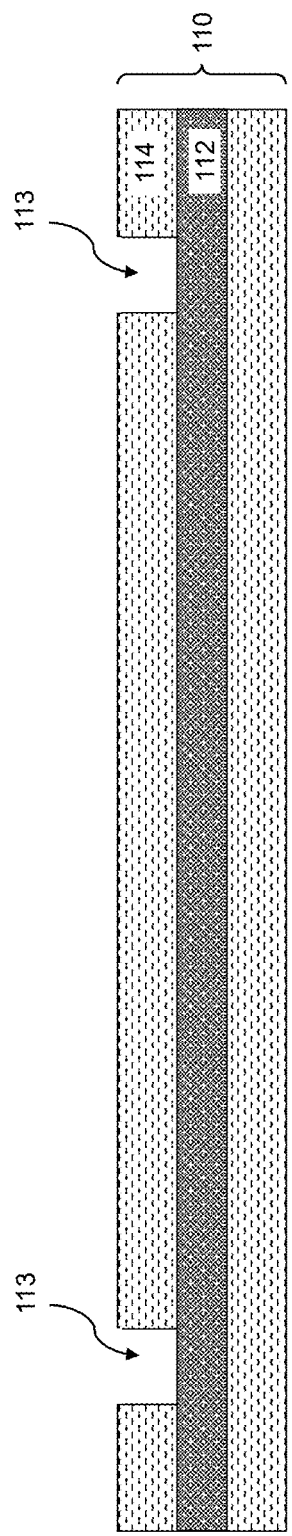
FIG. 7A illustrates a vertical cross-sectional view of an intermediate structure in which the recessed portion may be formed in the upper insulating layer of the package substrate according to one or more embodiments.
Figure 7B:
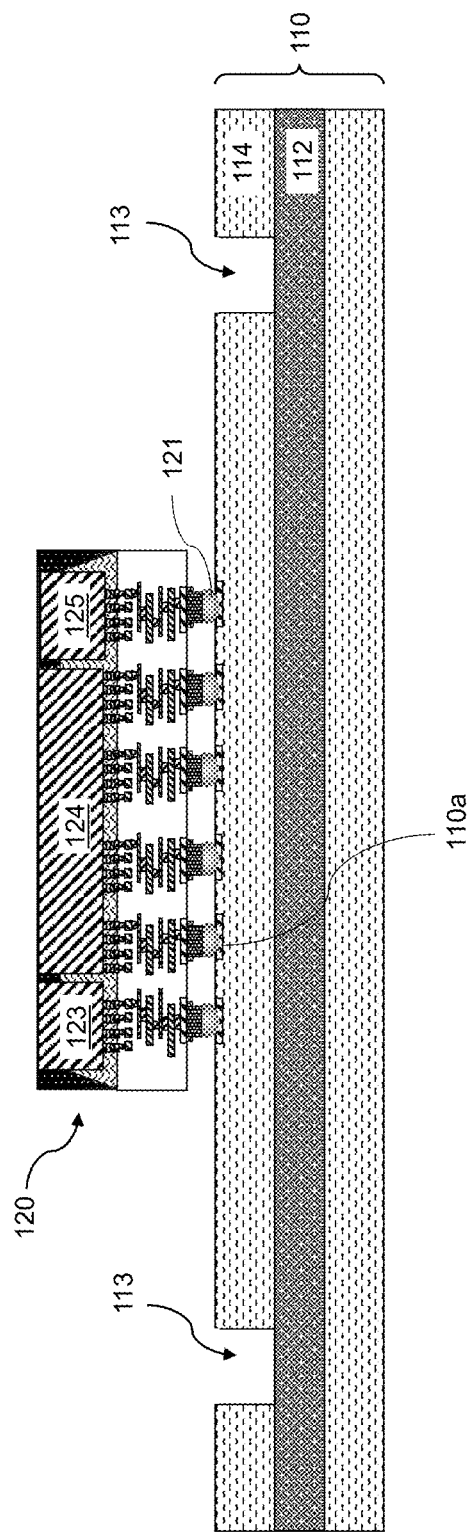
FIG. 7B illustrates a vertical cross-sectional view of an intermediate structure in which the interposer module may be mounted on the package substrate (e.g., via a flip chip bonding (FCB) process) according to one or more embodiments.

FIG. 7B illustrates a vertical cross-sectional view of an intermediate structure in which the interposer module 120 may be mounted on the package substrate 110 (e.g., via a flip chip bonding (FCB) process) according to one or more embodiments. As illustrated in FIG. 7B, the C4 bumps 121 of the interposer module 120 may be positioned on the metal bonding pads 110*a* of the package substrate 110 and heated in order to bond the C4 bumps 121 to the metal bonding pads 110*a*.

Figure 7C:
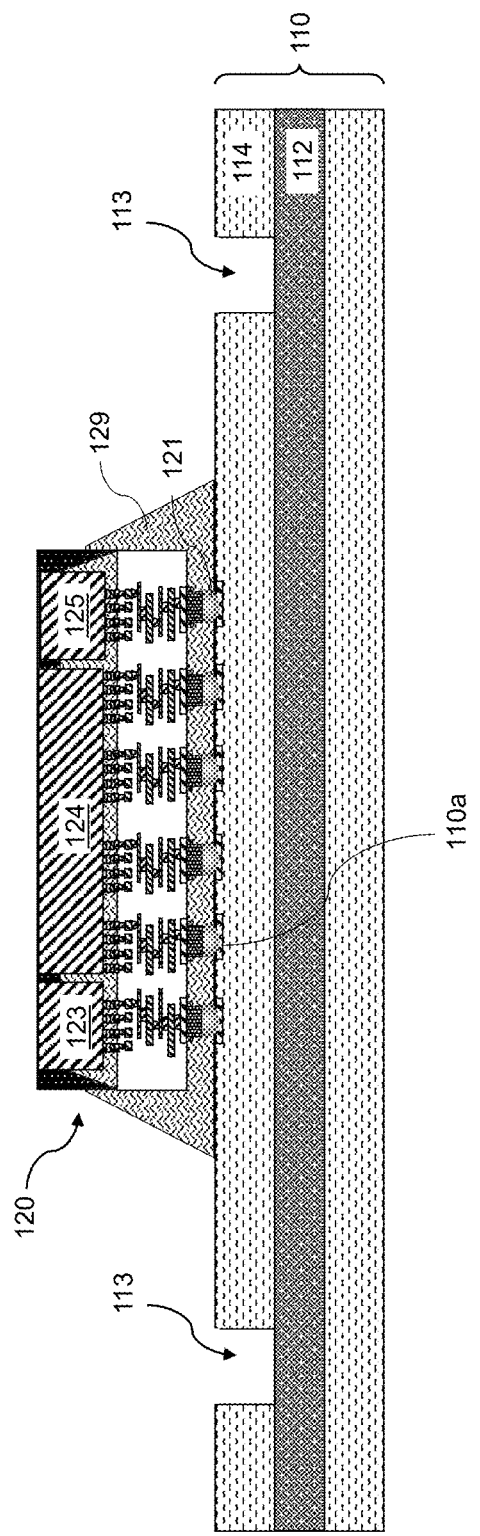
FIG. 7C illustrates a vertical cross-sectional view of an intermediate structure in which the package underfill layer may be formed on the package substrate according to one or more embodiments.

FIG. 7C illustrates a vertical cross-sectional view of an intermediate structure in which the package underfill layer 129 may be formed on the package substrate 110 according to one or more embodiments. The package underfill layer 129 may be formed of an epoxy-based polymeric material. As illustrated in FIG. 7C, the package underfill layer 129 may be formed under and around the interposer module 120 and the C4 bumps 121 so as to adhere the interposer module 120 to the package substrate 110. The package underfill layer 129 may then be cured, for example, in a box oven for about 90 minutes at about 150° C. to provide the package underfill layer 129 with a sufficient stiffness and mechanical strength.

Figure 7D:
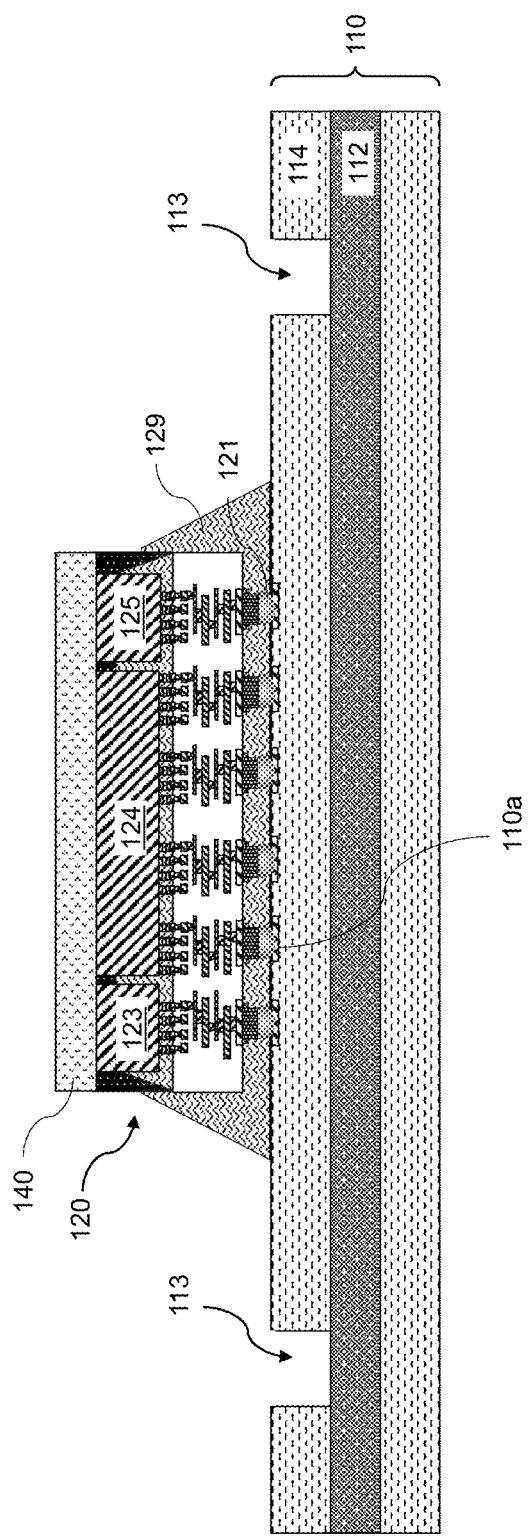
FIG. 7D illustrates a vertical cross-sectional view of an intermediate structure in which the TIM film may be formed on (e.g., dispensed on) or attached to the upper surface of the interposer module according to one or more embodiments.

FIG. 7D illustrates a vertical cross-sectional view of an intermediate structure in which the TIM film 140 may be formed on (e.g., dispensed on) or attached to the upper surface of the interposer module 120 according to one or more embodiments. The TIM film 140 may include, for example, a metal TIM film (e.g., a solder TIM), a thermal paste, thermal adhesive, thermal gap filler, thermal pad (e.g., silicone), thermal tape, a graphite TIM film, and a carbon nanotube TIM film. The TIM film 140 may be attached to the upper surface of the interposer module 120 by using, for example, a thermally conductive adhesive.

Figure 7E:
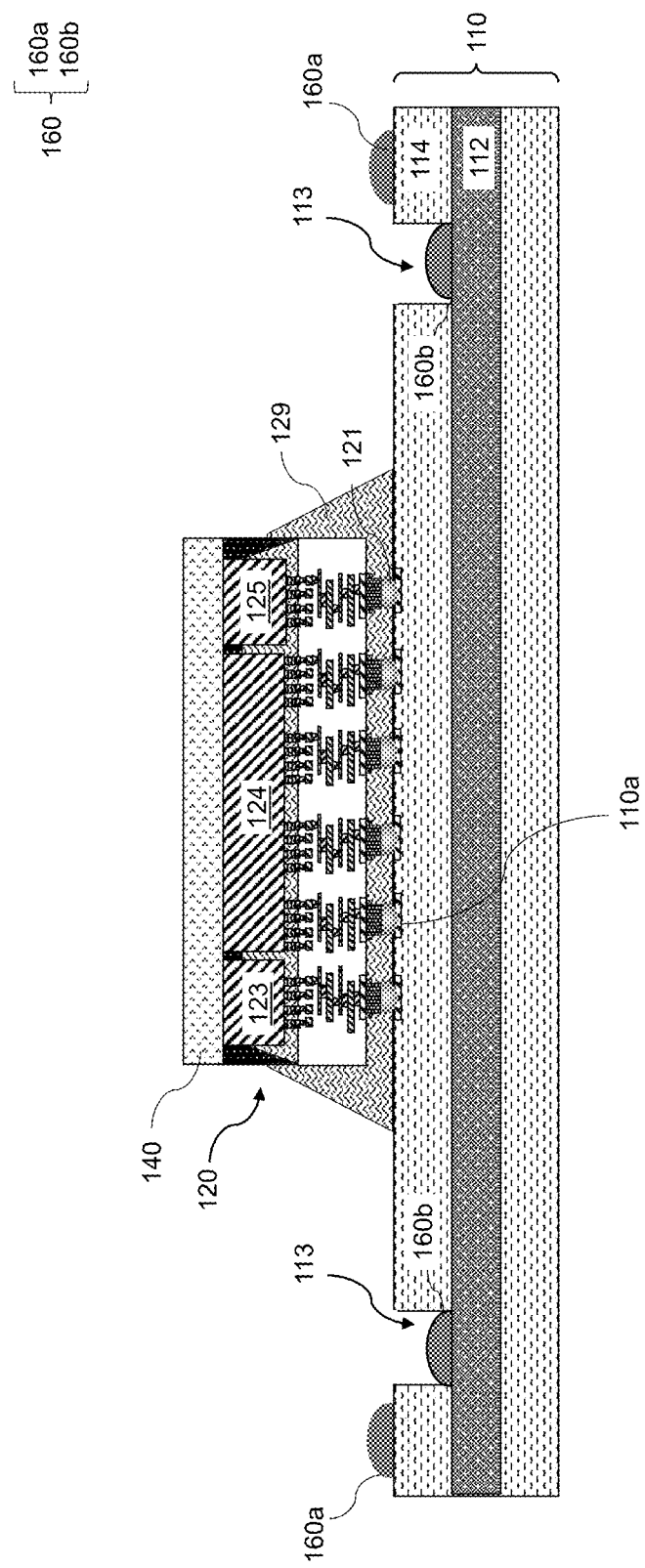
FIG. 7E illustrates a vertical cross-sectional view of an intermediate structure in which the adhesive may be applied to the package substrate according to one or more embodiments.

FIG. 7E illustrates a vertical cross-sectional view of an intermediate structure in which the adhesive 160 may be applied to the package substrate 110 according to one or more embodiments. The adhesive 160 may include, for example, a silicone adhesive or an epoxy adhesive. The adhesive 160 may be dispensed on the upper insulating layer 114 so as to form the adhesive outer portion 160*a* at a position corresponding to a placement of the outer foot 130*a* of the package lid 130. The adhesive 160 may be dispensed in a quantity sufficient to securely bond the outer foot 130*a* of the package lid 130 to the upper insulating layer 114. In particular, the adhesive 160 may be dispensed in an amount sufficient to form the adhesive outer portion 160*a* to have a desirable thickness after pressing the package lid 130 onto the adhesive 160.

The adhesive 160 may also be dispensed in the recessed portion 113 that has a shape and location corresponding to a shape and location of the inner foot 130*b*. The adhesive 160 may be dispensed in a quantity sufficient to securely bond the inner foot 130*b* of the package lid 130 to the package substrate 110. In particular, the adhesive 160 may be dispensed in an amount sufficient to form the adhesive inner portion 160*b* having a desirable thickness after inserting the inner foot 130*b* (not shown) into the recessed portion 113 and pressing the package lid 130 onto the adhesive 160.

The dispensed width of the adhesive outer portion 160*a* may be less than the ultimate width (after pressing on the package lid 130) of the adhesive outer portion 160*a*, and the dispensed width of the adhesive inner portion 160*b* may be less than the ultimate width (after pressing on the package lid 130) of the adhesive inner portion 160*b*. The dispensed thickness of the adhesive outer portion 160*a* may be greater than the ultimate thickness (after pressing on the package lid 130) of the adhesive outer portion 160*a*, and the dispensed thickness of the adhesive inner portion 160*b* may be less than the ultimate thickness (after pressing on the package lid 130) of the adhesive inner portion 160*b*.

Figure 7F:
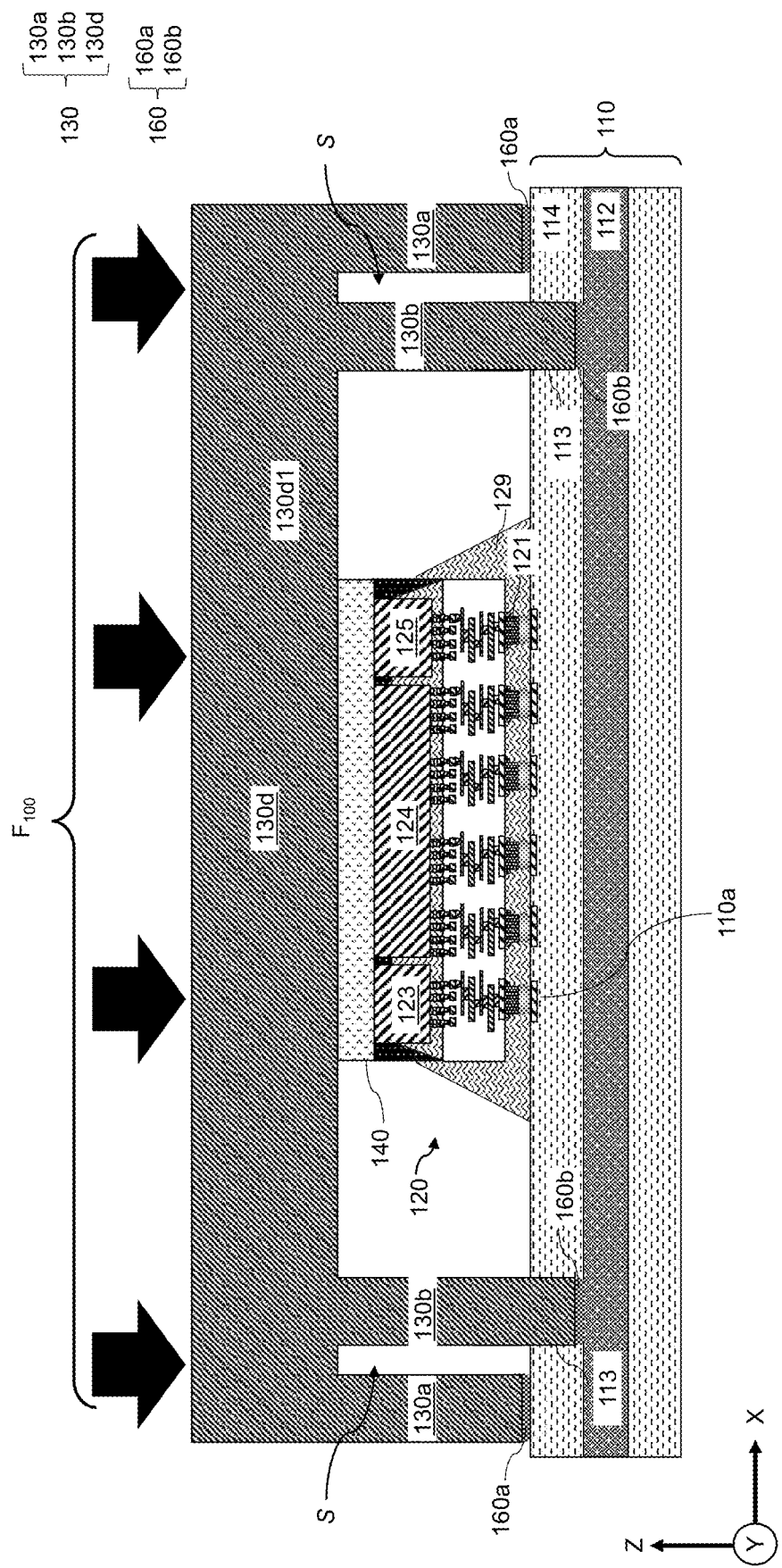
FIG. 7F illustrates a vertical cross-sectional view of an intermediate structure in which the package lid may be attached to (e.g., mounted on) the package substrate according to one or more embodiments.

FIG. 7F illustrates a vertical cross-sectional view of an intermediate structure in which the package lid 130 may be attached to (e.g., mounted on) the package substrate 110 according to one or more embodiments. As noted above, the package lid 130 may be composed of metal, ceramic or plastic and may be formed, for example, by milling using a computer numerical control (CNC) milling machine, or by molding or stamping the package lid 130 to include the inner foot 130*b*.

In FIG. 7F, the package substrate 110 with the interposer module 120 may be placed on a surface and the package lid 130 lowered down over the interposer module 120 and onto the package substrate 110. The outer foot 130*a* of the package lid 130 may then be aligned with the adhesive outer portion 160*a* formed on the package substrate 110, and the inner foot 130*b* of the package lid 130 may be aligned with the adhesive inner portion 160*b* formed on the package substrate 110. The package lid 130 may then be pressed downward by applying a pressing force F100 down (in the z-direction in FIG. 7F) onto the package lid 130 so that the outer foot 130*a* and inner foot 130*b* of the package lid 130 may contact the package substrate 110 through the adhesive 160.

Alternatively, the package lid 130 may be inverted (e.g., flipped) and placed on a surface (e.g., a flat surface), and the interposer module 120 on the package substrate 110 may be inverted and inserted into the package lid 130. The package substrate 110 and interposer module 120 may then be pressed by applying a pressing force down into the package lid 130 so that the outer foot 130*a* and inner foot 130*b* of the package lid 130 may contact the package substrate 110 through the adhesive 160.

The package lid 130 may be clamped to the package substrate 110 for a period to allow the adhesive 160 to cure and form a secure bond between the package substrate 110 and the package lid 130. The clamping of the package lid 130 to the package substrate 110 may be performed, for example, by using a heat clamp module. The heat clamp module may apply a uniform force across the upper surface of the package lid 130. In one or more embodiments, the heat clamp module may apply the pressing force F100 to the package lid 130.

Figure 7G:
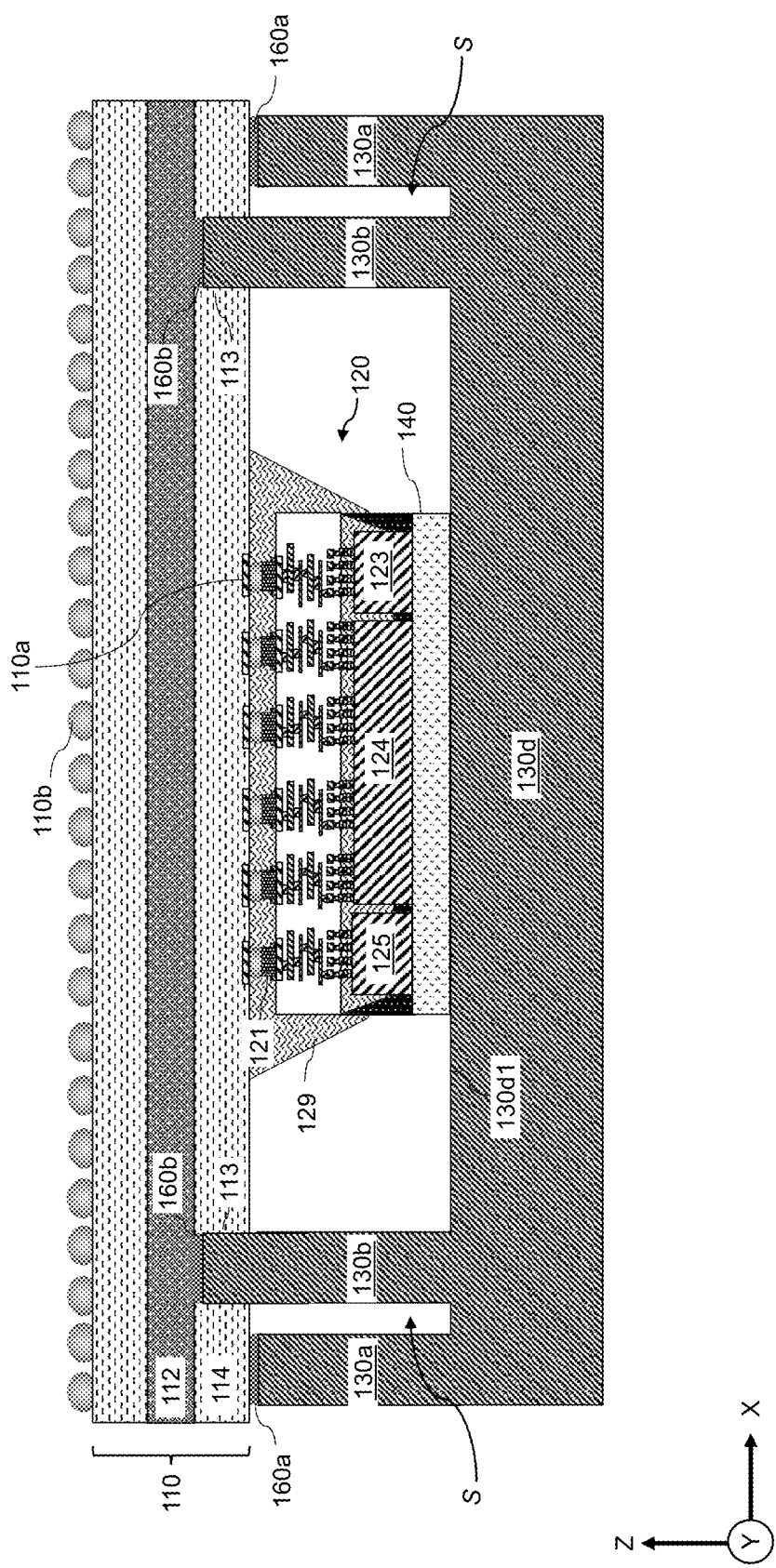
FIG. 7G illustrates a vertical cross-sectional view of an intermediate structure in which a plurality of solder balls may be formed on the package substrate according to one or more embodiments.

FIG. 7G illustrates a vertical cross-sectional view of an intermediate structure in which a plurality of solder balls 110*b* may be formed on the package substrate 110 according to one or more embodiments. The plurality of solder balls 110*b* may constitute a ball-grid array (BGA) that may allow the package assembly 100 to be securely mounted (e.g., by surface mount technology (SMT)) on a substrate such as a printed circuit board and electrically coupled to the substrate.

Figure 8:
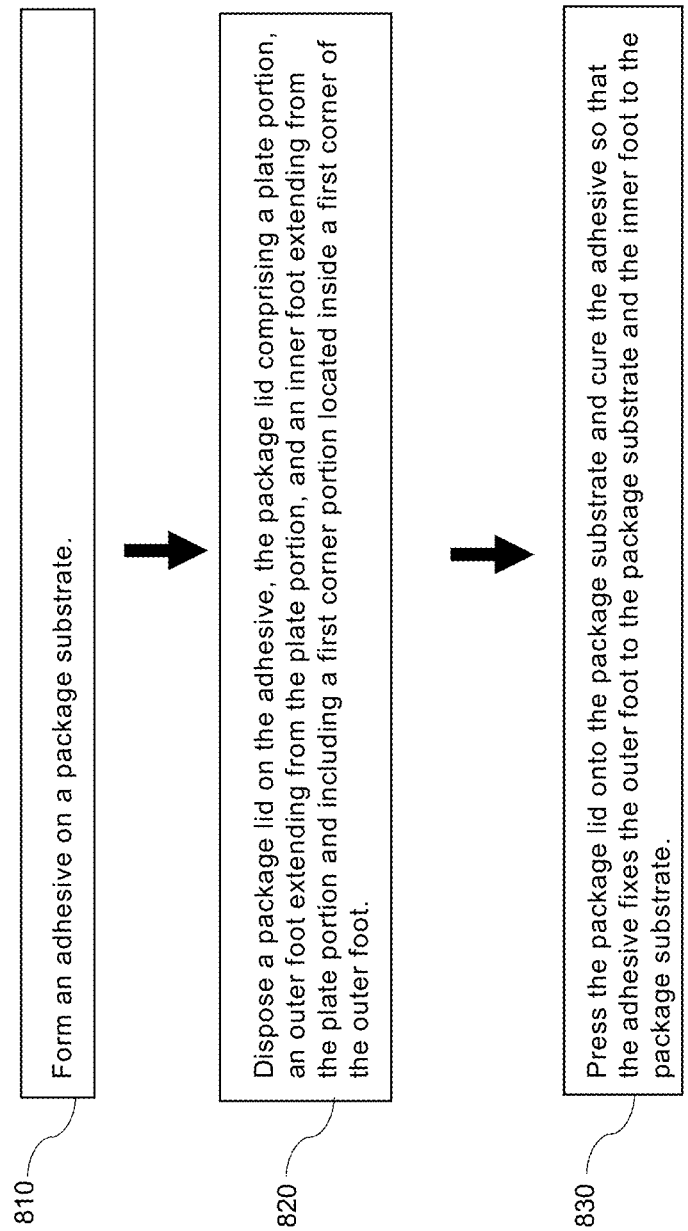
FIG. 8 is a flow chart illustrating a method of making a package assembly according to one or more embodiments.

FIG. 8 is a flow chart illustrating a method of making a package assembly according to one or more embodiments. Step 810 includes forming an adhesive on a package substrate. Step 820 includes placing a package lid on the adhesive, the package lid including a plate portion, an outer foot extending from the plate portion, and an inner foot extending from the plate portion and including a first corner portion located inside a first corner of the outer foot. Step 830 includes pressing the package lid onto the package substrate and curing the adhesive so that the adhesive adheres the outer foot to the package substrate and the inner foot to the package substrate.

Figure 9:
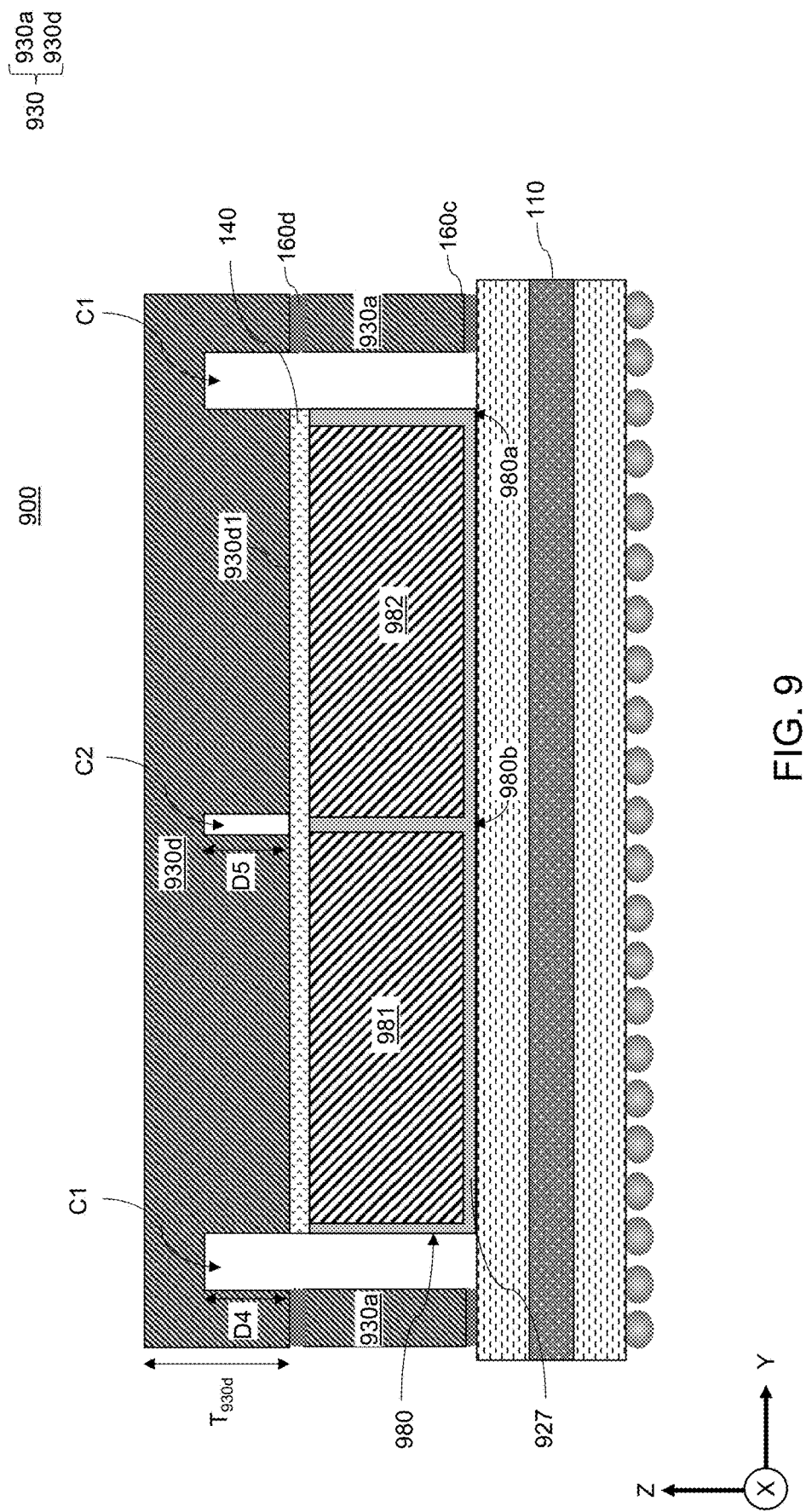
FIG. 9 is a vertical cross-sectional view of a package assembly, according to one or more embodiments.

FIG. 9 is a vertical cross-sectional view of a package assembly 900, according to one or more embodiments. The package assembly 900 may include the package substrate 110 and a molded die module 980 mounted on the package substrate 110. The molded die module 980 may include a first semiconductor die 981 and a second semiconductor die 982 that may be molded together by a molding material 927. The molding material 927 may be composed of a material that is the same as or similar to the molding material layer 127 described above. The first semiconductor die 981 and second semiconductor die 982 may be the same as or similar to the semiconductor dies (e.g., 123, 124, 125) described above. In particular, the first semiconductor die 981 and second semiconductor die 982 may include SOC devices. The TIM film 140 (e.g., SOC TIM) may be formed on a surface of the molded die module 980.

A package lid 930 may cover the molded die module 980. The package lid 930 may be bonded to the package substrate 110. The package lid 930 may include a plate portion 930d (e.g., island portion) that may have a planar shape. The plate portion 930d may include a bottom surface 930d1 that may contact the TIM film 140.

A conventional package lid may include a plate portion (e.g., island portion) having a flat bottom surface. A package lid having such a conventional design may have a die-to-die (D2D) molding stress of 1.00. The D2D molding area may have more stress at a high temperature (HT) due to a coupling effect between the package lid and the die. This stress may induce a crack in the molding material.

In contrast, an embodiment package assembly 900 may include a package lid 930 that may have a recessed design that reduces D2D molding stress in the molded die module 980. The recessed lid design may reduce the D2D molding stress at the HT, for example, to 0.90. Advantageously, the recessed lid design may not require a significant change the steps in a process of making the package assembly 900.

As illustrated in FIG. 9, the embodiment package lid 930 may include a first cavity C1 formed at an edge of the molded die module 980. In particular, the first cavity C1 may be formed at the molding material 927 at a corner 980a of a molded die module 980. The first cavity C1 may have a depth D4 in a range from 0.1 mm to 30 mm. The embodiment package lid 930 may also include a second cavity C2 formed at an edge of the molded die module 980 and along to a D2D molding gap 980b of the molded die module 980. The second cavity C2 may have a depth D5 that is also in a range from 1 mm to 30 mm. The depth D4 of the first cavity C1 and the depth D5 of the second cavity C2 may be the same or different. Each of the depth D4 of the first cavity C1 and the depth D5 of the second cavity C2 may be in a range of 5% to 60% of the thickness $T_{930d}$ of the plate portion 930d.

The package lid 1630 may also include a ring portion 1630a that may bond the plate portion 1630d to the package substrate 110. The ring portion 1630a may be bonded to the package substrate by a third adhesive 160c, and bonded to the plate portion 1630d by a fourth adhesive 160d. Although it is not illustrated in FIG. 16A, the ring portion 1630a may be embedded in the substrate 110 in a similar manner as described above (e.g., see FIG. 1D, 1E, 4A, 4B, 6A, 6B). The ring portion 1630a may have any other inner foot design described above (e.g., the designs of inner foot 430b in FIG. 4B, inner foot 530b in FIG. 5B, or inner foot 630b in FIG. 6B).

Figure 10B:
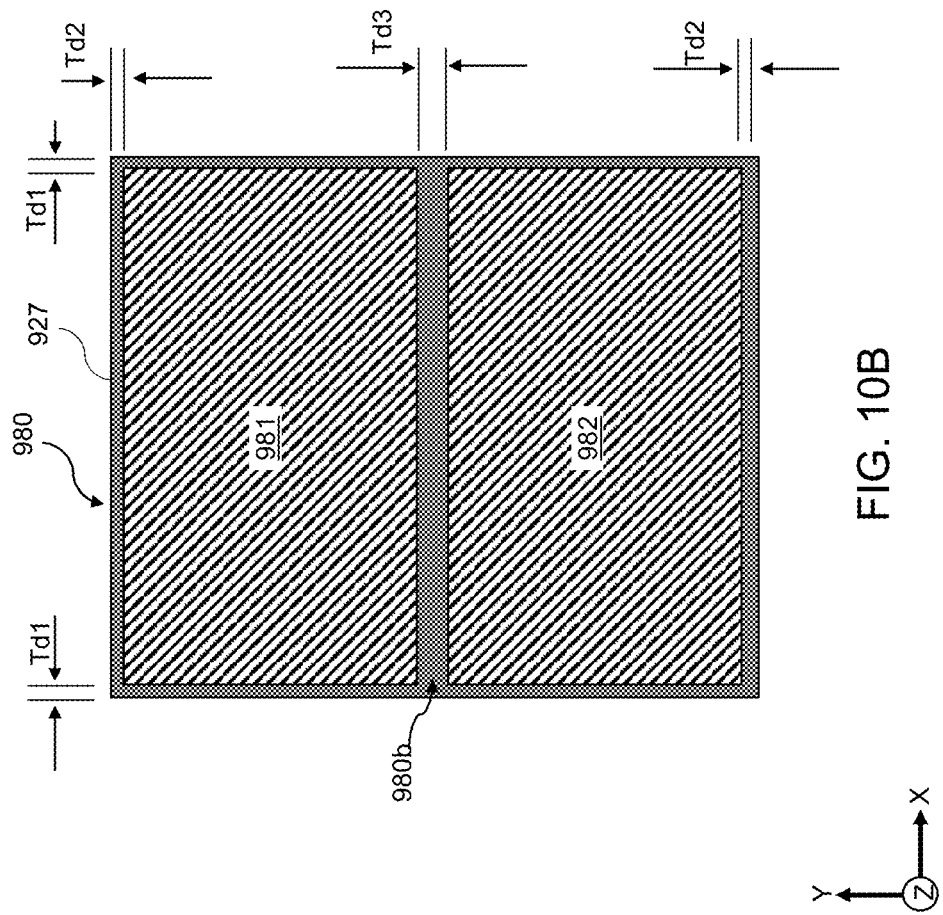
FIG. 10B is a plan view of the molded die module, according to one or more embodiments.
Figure 10A:
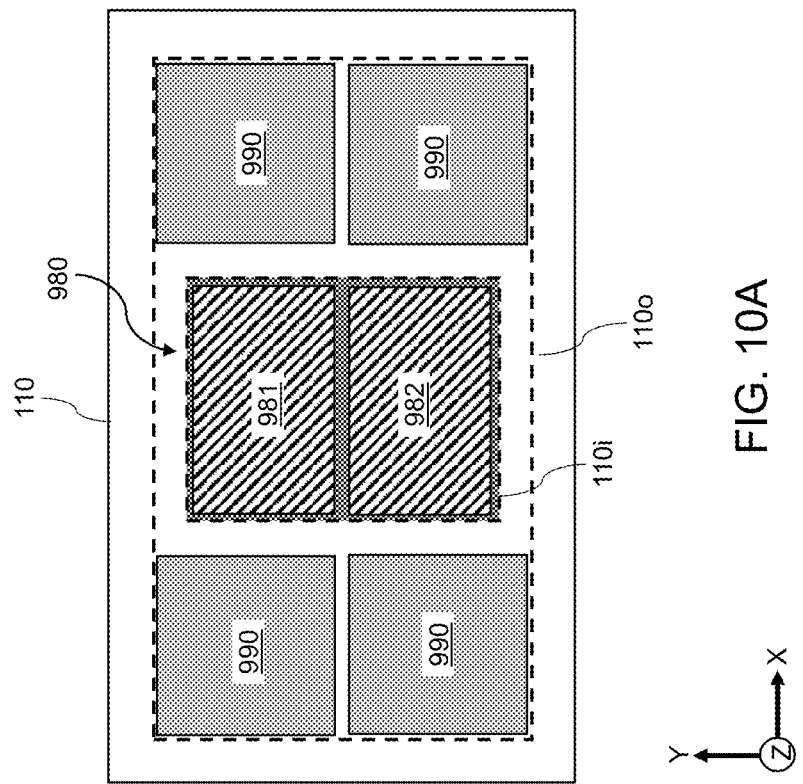
FIG. 10A is a plan view of a surface of the package substrate in the package assembly, according to one or more embodiments.

FIG. 10A is a plan view of a surface of the package substrate 110 in the package assembly 900, according to one or more embodiments. The package lid 930 is not illustrated in FIG. 10A for ease of explanation.

As illustrated in FIG. 10A, one or more secondary dies 990 may be formed on the package substrate 110. The secondary dies 990 may also be the same or similar the semiconductor dies (e.g., 123, 124, 125) described above. In particular, the secondary dies 990 may include a high-bandwidth memory (HBM) device such as a dynamic random access memory (DRAM) device.

The package substrate 110 may include a package substrate outer area 110o that may correspond to the area of the molded die module 980 together with the secondary dies 990. That is, the boundary of the package substrate outer area 110o may be coextensive with an outer surface of the secondary dies 990. The package substrate 110 may also include a package substrate inner area 110i that corresponds to the area of the molded die module 980. That is, the boundary of the package substrate inner area 110i may be coextensive with the outer surface of the molded die module 980.

FIG. 10B is a plan view of the molded die module 980, according to one or more embodiments. As illustrated in FIG. 10B, the molding material 927 may have a first thickness Td1 that extends from the sides of the first semiconductor die 981 in the x-direction, and from the sides of the second semiconductor die 982 in the x-direction. The first thickness Td1 may be substantially uniform over the sides of the first semiconductor die 981 and the second semiconductor die 982. The molding material 927 may have also have a second thickness Td2 that extends from an upper side of the first semiconductor die 981 in the y-direction, and from the lower side of the second semiconductor die 982 in the y-direction. The second thickness Td2 may also be substantially uniform over the sides of the first semiconductor die 981 and the second semiconductor die 982. The molding material 927 may have also have a third thickness Td3 that is formed in the D2D molding gap 980b that extends in the x-direction in the molded die module 980. The third thickness Td3 may also be substantially uniform along a lower side of the first semiconductor die 981 and an upper side of the second semiconductor die 982.

FIG. 11A is a perspective view of the plate portion 930d of the package lid 930, according to one or more embodiments. The bottom surface 930d1 of the plate portion 930d may include a plate portion inner area 930di corresponding to the package substrate inner area 110i. That is, the plate portion inner area 930di may be substantially aligned in the z-direction with the package substrate inner area 110i when the package lid 930 is mounted on the package substrate 110.

The bottom surface 930d1 may also include a plate portion outer area 930do corresponding to the package substrate outer area 110o. That is, the plate portion outer area 930do may be substantially aligned in the z-direction with the package substrate outer area 110o when the package lid 930 is mounted on the package substrate 110.

The corner 980a of a molded die module 980 may be substantially aligned with a corner of the plate portion inner area 930di. Thus, the first cavity C1 may be formed at a corner of the plate portion inner area 930di. The first cavity C1 may be formed at one or more of the corners of the plate portion inner area 930di. An edge of the first cavity C1 may coincide with the corner of the plate portion inner area 930di. The first cavity C1 may extend from the corner of the plate portion inner area 930di up to the boundary of the plate portion outer area 930do.

The second cavity C2 may be formed along the D2D molding gap 980b (e.g., shown in FIG. 10B) of the molded die module 980. The second cavity C2 may be formed on one or both of the opposing sides of the plate portion inner area 930*di* and extend in the x-direction. The second cavities C2 may be substantially aligned with each other and substantially aligned with the D2D molding gap 980*b*. An edge of the second cavity C2 may coincide with a boundary of the plate portion inner area 930*di*. The second cavity C2 may extend from the plate portion inner area 930*di* up to the boundary of the plate portion outer area 930*do*.

FIG. 11B is a plan view of the bottom surface 930*d*1 of the plate portion 930*d*, according to one or more embodiments. The cross-sectional view in FIG. 9 is a view along the cross-section II-IF of the plate portion 930*d* in FIG. 11B.

The first cavity C1 may have a length Ld4 in the x-direction. The length Ld4 may be greater than or equal to the first thickness Td1 of the molding material 927. The first cavity C1 may also have and a width Wd5 in the y-direction. The width Wd5 may be greater than or equal to the second thickness Td2 of the molding material 927. The length Ld4 of the first cavity C1 may also be substantially the same as the width Wd5 of the first cavity C1. That is, the first cavity C1 may have a square shape in the plan view. Other shapes of the first cavity C1 are contemplated by this disclosure.

The second cavity C2 may have a width Wd6 in the y-direction. The width Wd6 of the second cavity C2 may be substantially uniform. The width Wd6 of the second cavity C2 may be greater than or equal to the third thickness Td3 of the molding material 927. The second cavity C2 may have a linear shape. In particular, the second cavity C2 may have a straight-line shape. Each of the first thickness Td1, second thickness Td2 and third thickness Td3 of the molding material 927, the length Ld4 and width Wd5 of the first cavity C1, and the width Wd6 of the second cavity C2 may be greater than zero.

Figure 12B:
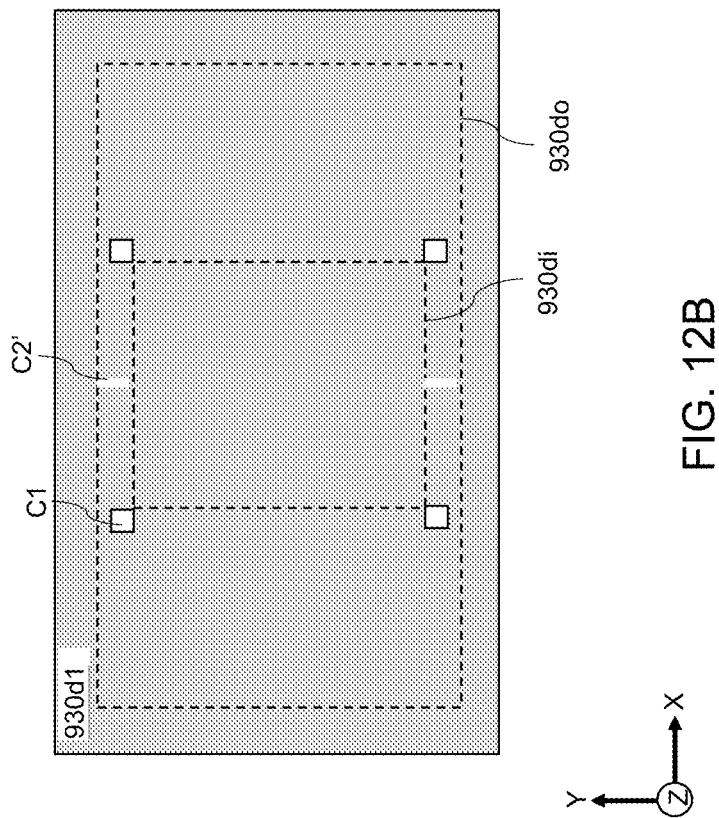
FIG. 12B is a plan view of the bottom surface of the plate portion in the alternative design of the package assembly, according to one or more embodiments
Figure 12A:
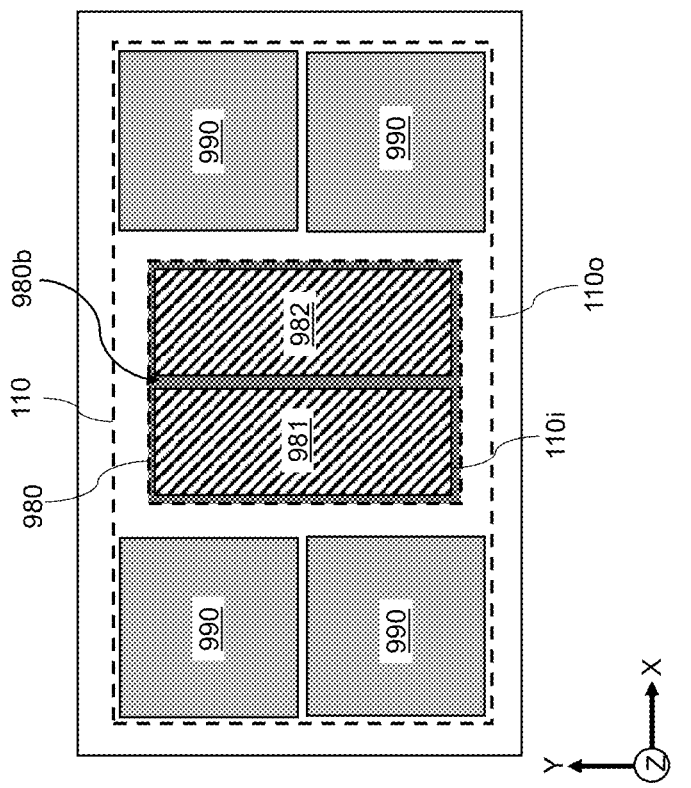
FIG. 12A is a plan view of a surface of the package substrate in an alternative design of the package assembly, according to one or more embodiments.

FIGS. 12A-12B illustrate an alternative design of the package assembly 900, according to one or more embodiments. FIG. 12A is a plan view of a surface of the package substrate 110 in the alternative design of the package assembly 900, according to one or more embodiments. In this alternative design, the first semiconductor die 981 and second semiconductor die 982 may be arranged longitudinally in the y-direction in the molded die module 980. Therefore, the D2D molding gap 980*b* may extend in the y-direction in this alternative design. The secondary dies 990 may be arranged similarly as in FIG. 10A. The package substrate inner area 110*i* and package substrate outer area 110*o* may be configured similarly as in FIG. 10A.

FIG. 12B is a plan view of the bottom surface 930*d*1 of the plate portion 930*d* in the alternative design of the package assembly 900, according to one or more embodiments. In this alternative design, the plate portion inner area 930*di* and plate portion outer area 930*do* may be configured similarly as in FIGS. 11A and 11B. The first cavity C1 may also be formed at one or more of the corners of the plate portion inner area 930*di*.

However, the alternative design illustrated in FIG. 12B includes one or more second cavities C2' that extend in the y-direction. In particular, the second cavities C2' may be arranged on opposing sides of the plate portion inner area 930*di* in the y-direction. The second cavities C2' may be located at an edge of the molded die module 980 and aligned with the D2D molding gap 980*b* that may also extend in the y-direction. The second cavities C2' may be substantially the same as the second cavities C2. The second cavities C2' may extend to the boundary of the plate potion outer area 930*do*. The second cavities C2' may have a width Wd6 that is greater than the third thickness Td3 of the molding material 927 that is formed in the D2D molding gap 980*b*. The second cavities C2' may have a depth in a range from 0.1 mm to 30 mm, and in a range from 5% to 60% of the thickness of the plate portion 930*d*. However, a length of the second cavities C2' may be less than a length of the cavities C2. In one or more embodiments, the length of the second cavities C2' may be in a range from 10% to 50% of the length of the cavities C2.

Figure 13B:
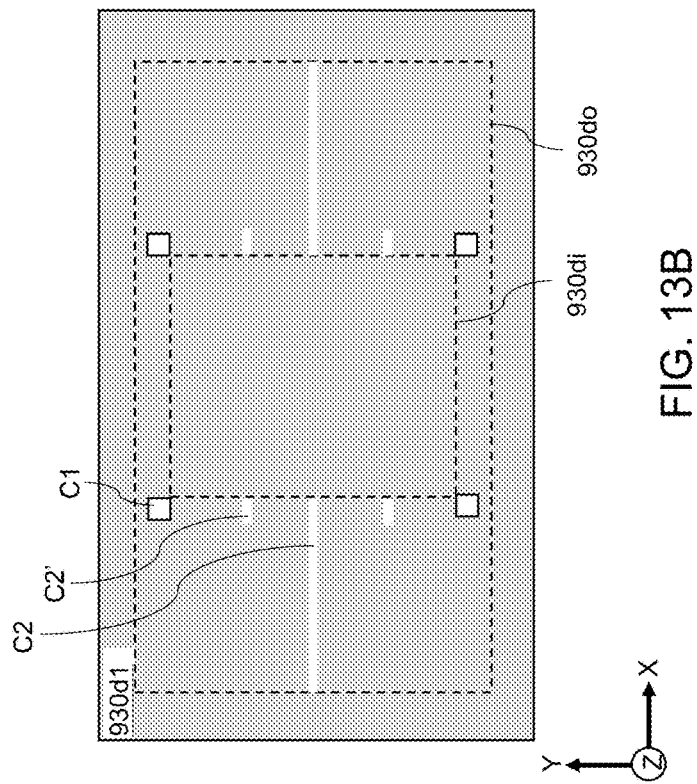
FIG. 13B is a plan view of the bottom surface of the plate portion in the alternative design of the package assembly, according to one or more embodiments.
Figure 13A:
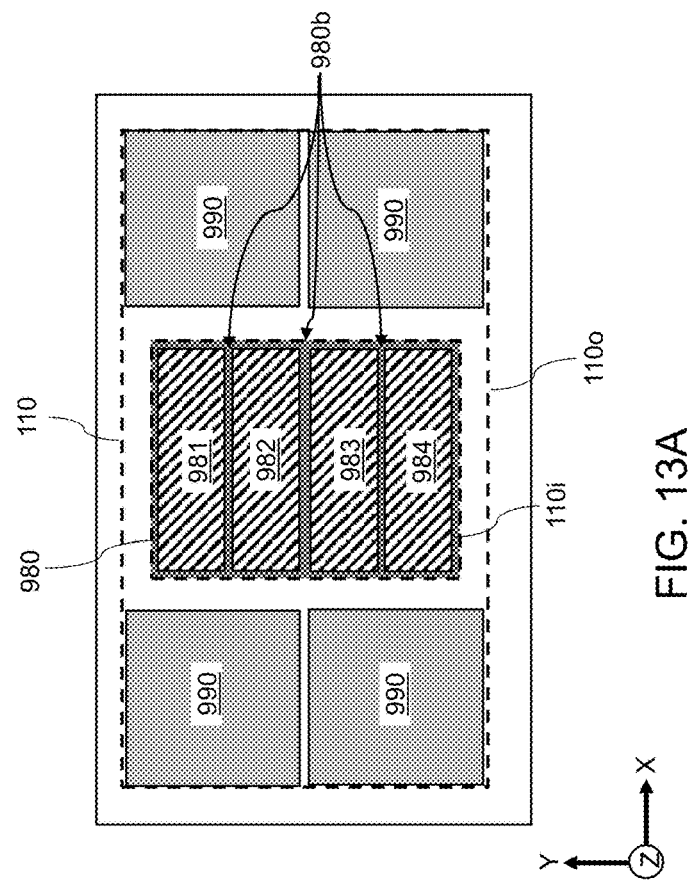
FIG. 13A is a plan view of a surface of the package substrate in an alternative design of the package assembly, according to one or more embodiments.

FIGS. 13A-13B illustrate another alternative design of the package assembly 900, according to one or more embodiments. FIG. 13A is a plan view of a surface of the package substrate 110 in the alternative design of the package assembly 900, according to one or more embodiments. The molded die module 980 may include the first semiconductor die 981 and second semiconductor die 982, along with a third semiconductor die 983 and fourth semiconductor die 984. The first semiconductor die 981, second semiconductor die 982, third semiconductor die 983 and fourth semiconductor die 984 may be arranged longitudinally in the x-direction in the molded die module 980. Therefore, there may be three D2D molding gaps 980*b* extending in the x-direction in this alternative design. The secondary dies 990 may be arranged similarly as in FIG. 10A. The package substrate inner area 110*i* and package substrate outer area 110*o* may be configured similarly as in FIG. 10A.

FIG. 13B is a plan view of the bottom surface 930*d*1 of the plate portion 930*d* in the alternative design of the package assembly 900, according to one or more embodiments. In this alternative design, the plate portion inner area 930*di* and plate portion outer area 930*do* may be configured similarly as in FIGS. 11A and 11B. The first cavity C1 may also be formed at one or more of the corners of the plate portion inner area 930*di*. The second cavities C2 may be formed on opposing sides of the plate portion inner area 930*di* in the x-direction. The second cavities C2 may be aligned with the D2D molding gap 980*b* between the second semiconductor die 982 and third semiconductor die 983. The second cavities C2' may be formed on opposing sides of the plate portion inner area 930*di* in the x-direction. The second cavities C2' may be aligned with the D2D molding gap 980*b* between the first semiconductor die 981 and second semiconductor die 982. The second cavities C2' may also be aligned with the D2D molding gap 980*b* between the third semiconductor die 983 and fourth semiconductor die 984.

Figure 14B:
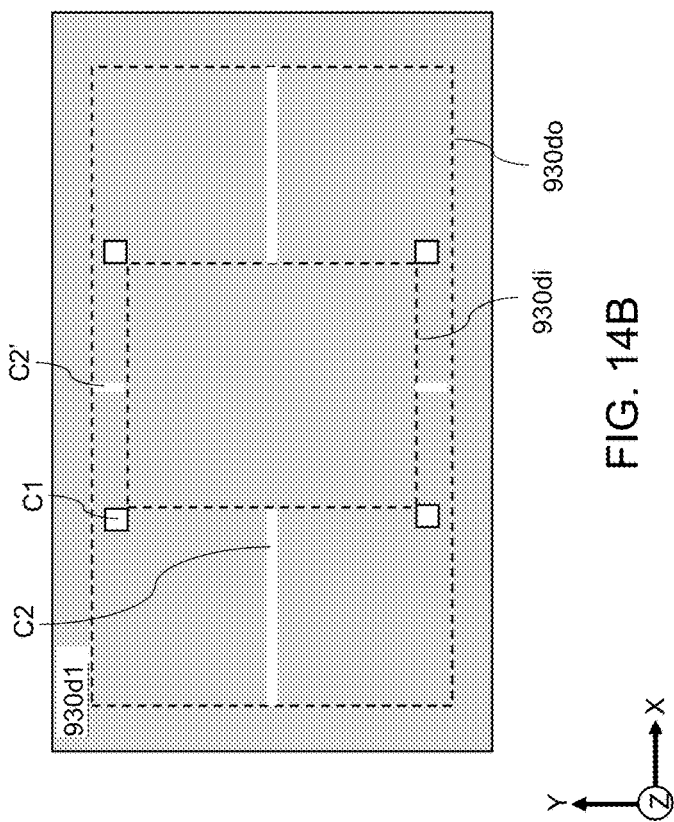
FIG. 14B is a plan view of the bottom surface of the plate portion in the alternative design of the package assembly, according to one or more embodiments.
Figure 14A:
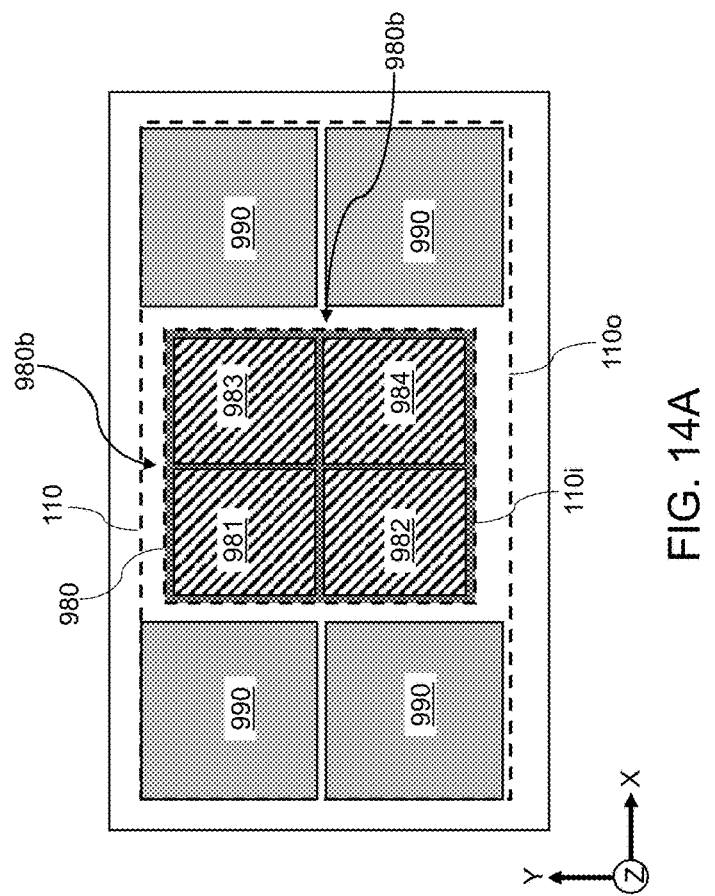
FIG. 14A is a plan view of a surface of the package substrate in an alternative design of the package assembly, according to one or more embodiments.

FIGS. 14A-14B illustrate another alternative design of the package assembly 900, according to one or more embodiments. FIG. 14A is a plan view of a surface of the package substrate 110 in the alternative design of the package assembly 900, according to one or more embodiments. The molded die module 980 may include the first semiconductor die 981 and second semiconductor die 982, along with the third semiconductor die 983 and the fourth semiconductor die 984. The first semiconductor die 981, second semiconductor die 982, third semiconductor die 983 and fourth semiconductor die 984 may be arranged in a 2×2 configuration in the molded die module 980. Therefore, there may be a D2D molding gap 980*b* extending in the x-direction, and a D2D molding gap 980*b* extending in the y-direction in this alternative design. The secondary dies 990 may be arranged similarly as in FIG. 10A. The package substrate inner area 110*i* and package substrate outer area 110*o* may be configured similarly as in FIG. 10A.

FIG. 14B is a plan view of the bottom surface 930*d*1 of the plate portion 930*d* in the alternative design of the package assembly 900, according to one or more embodiments. In this alternative design, the plate portion inner area 930*di* and plate portion outer area 930*do* may be configured similarly as in FIGS. 11A and 11B. The first cavity C1 may also be formed at one or more of the corners of the plate portion inner area 930*di*. The second cavities C2 may be formed on opposing sides of the plate portion inner area 930*di* in the x-direction. The second cavities C2 may be aligned with the D2D molding gap 980*b* that extends in the x-direction between the first semiconductor die 981 and second semiconductor die 982, and between the third semiconductor die 983 and fourth semiconductor die 984. The second cavities C2' may be formed on opposing sides of the plate portion inner area 930*di* in the y-direction. The second cavities C2' may be aligned with the D2D molding gap 980*b* that extends in the y-direction between the first semiconductor die 981 and third semiconductor die 983, and between the second semiconductor die 982 and fourth semiconductor die 984.

Figure 15:
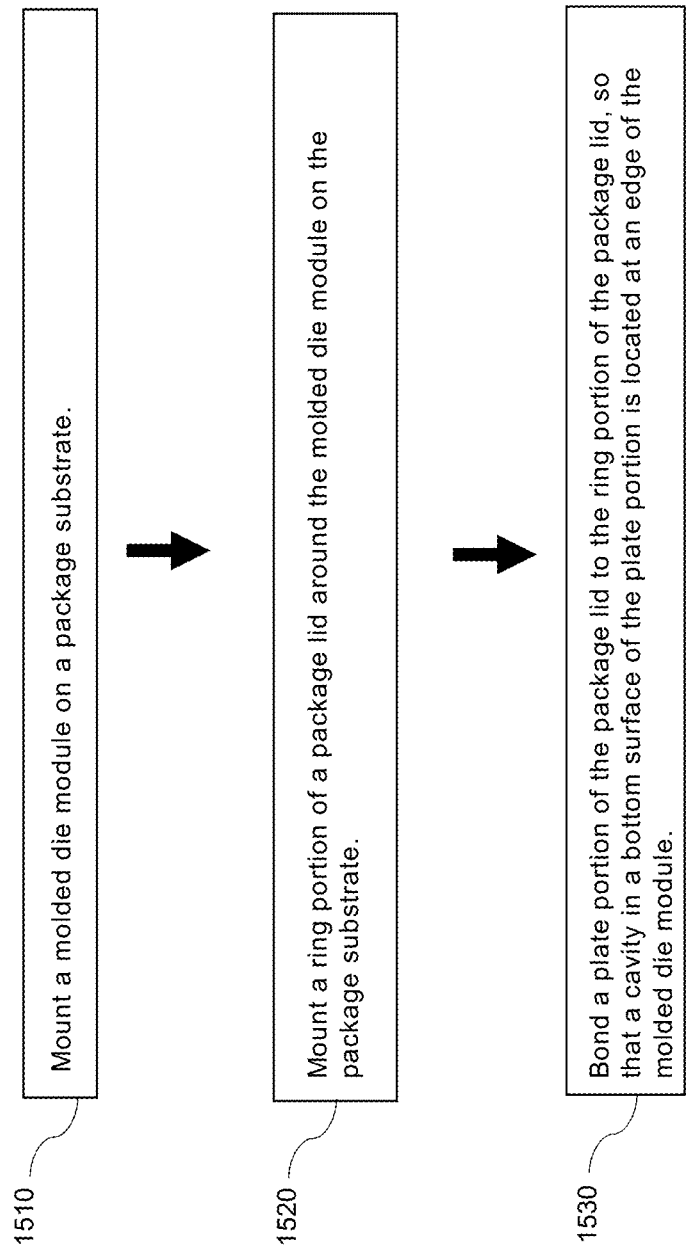
FIG. 15 is a flow chart illustrating a method of making a package assembly according to one or more embodiments.

FIG. 15 is a flow chart illustrating a method of making a package assembly according to one or more embodiments. Step 1510 includes mounting a molded die module on a package substrate. Step 1520 includes mounting a ring portion of a package lid around the molded die module on the package substrate. Step 1530 includes bonding a plate portion of the package lid to the ring portion of the package lid, so that a cavity in a bottom surface of the plate portion is located at an edge of the molded die module.

Referring now to FIGS. 16A-17D, one or more embodiments may include a dug lid design for stress mitigation of a secondary die TIM film (e.g., a DRAM TIM). In a typical package assembly, a secondary die TIM film may have more stress at room temperature (RT) due to a coupling effect between the package lid and a secondary die. The result may induce delamination of the secondary die TIM film.

In one or embodiments of the present disclosure, a digging area (e.g., cavity may be located in the package lid at the corner of the secondary die (e.g., DRAM die). The digging area may reduce secondary die TIM P1 stress (e.g., principal stress) in a package assembly and decrease delamination risk. The dug design may be implemented, for example, in any die or mold structure.

Figure 16A:
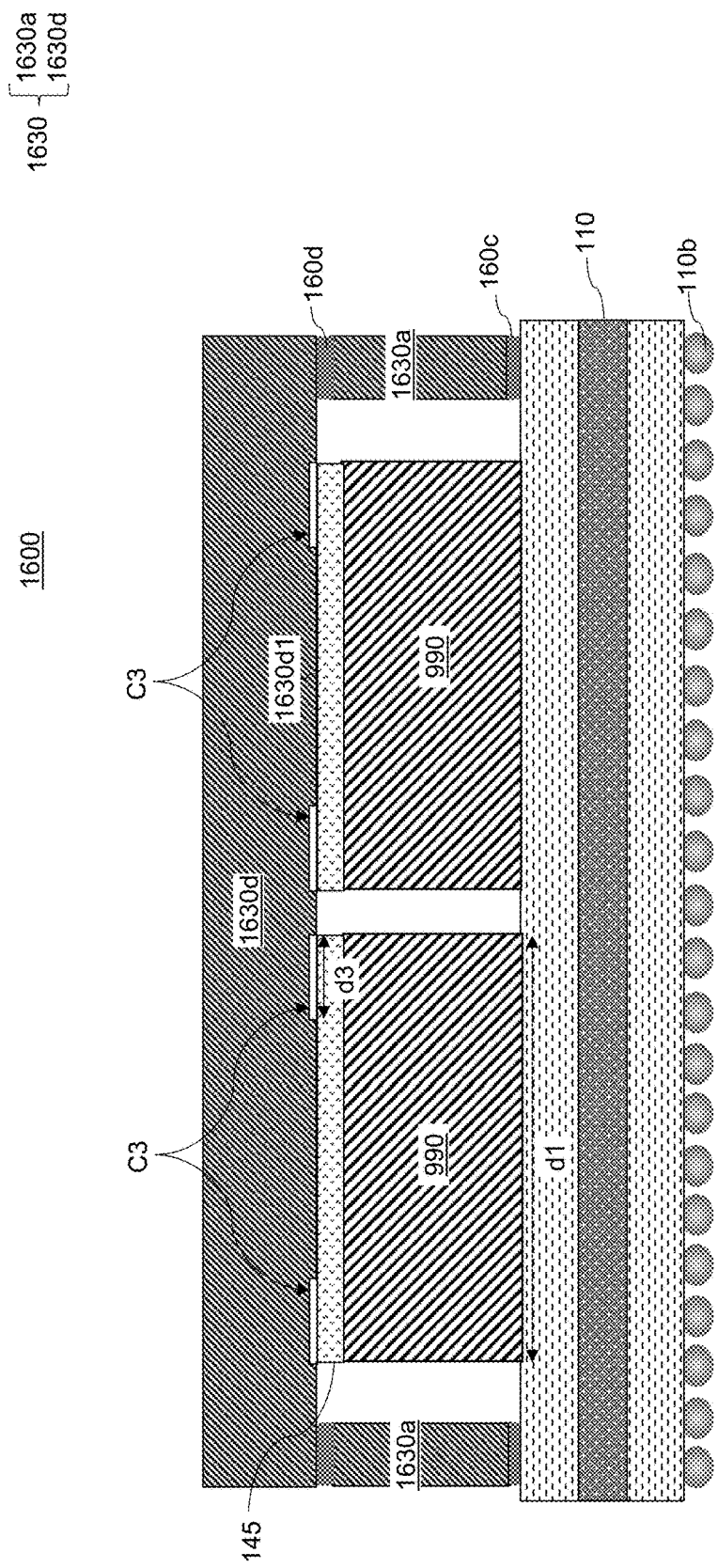
FIG. 16A is a vertical cross-sectional view of a package assembly according to one or more embodiments.

FIG. 16A is a vertical cross-sectional view of a package assembly 1600 according to one or more embodiments. The package assembly 1600 may include the package substrate 110, and a molded die module (not shown) mounted on the package substrate 110. One or more secondary dies 990 may also be mounted on the package substrate 110. The secondary dies 990 may be the same or similar the semiconductor dies (e.g., 123, 124, 125) described above. In particular, the secondary dies 990 may include a high-bandwidth memory (HBM) device such as a dynamic random access memory (DRAM) device. A TIM film 145 (e.g., secondary die TIM film or DRAM TIM) may be on each of the secondary dies 990. The TIM film 145 may have a shape that corresponds a shape of the secondary die 990 so that a sidewall of the TIM film 145 may be substantially aligned with a sidewall of the secondary die 990 around an entire perimeter of the secondary die 990.

A package lid 1630 may cover the molded die module and secondary dies 990. The package lid 1630 may be bonded to the package substrate 110. The package lid 1630 may include a plate portion 1630*d* (e.g., island portion) that may have a planar shape. The plate portion 1630*d* may include a bottom surface 1630*d*1 that may contact the TIM film 145.

Some package lid designs may include a plate portion (e.g., island portion) having a flat bottom surface. However, in some embodiments, the plate portion 1630*d* of the package lid 1630 may have a recessed design (e.g., a dug lid design) including one or more cavities. The one or more cavities (e.g., digging areas) may be formed in the plate portion 1630*d* at or near the corner of a secondary die 990.

The dug lid design may reduce secondary die TIM stress and delamination risk. With the dug lid design, stress on the TIM film 145 (e.g., die to die (DtD) molding stress) may be reduced from about 1.00 in a typical package assembly (e.g., a conformal lid design without digging), to about 0.95 or less in the package assembly 1600.

As illustrated in FIG. 16A, the plate portion 1630*d* may include a cavity C3 formed at a corner (e.g., a corner edge) of the DRAM die 990. The cavity C3 may have a depth (in the Z direction) in a range from 0.1 mm to 5 mm, and in a range from 1% to 20% of the thickness of the plate portion 1630*d*. The cavity C3 may also a length d3 (in the Y direction) in a range from 0.1 mm to 20 mm, and in range from 1% to 20% of a length d1 (in the Y direction) of the secondary die 990. It should be noted that the plate portion 1630*d* may include the cavity C3 in addition to any one of the cavities C1, C2 and C2' described above with respect to FIGS. 9-14B.

The package lid 930 may also include a ring portion 930*a* that may bond the plate portion 930*d* to the package substrate 110. The ring portion 930*a* may be bonded to the package substrate by a third adhesive 160*c*, and bonded to the plate portion 930*d* by a fourth adhesive 160*d*. Although it is not illustrated in FIG. 9, the ring portion 930*a* may be embedded in the substrate 110 in a similar manner as described above (e.g., see FIG. 1D, 1E, 4A, 4B, 6A, 6B). The ring portion 930*a* may have any other inner foot design described above (e.g., the designs of inner foot 430*b* in FIG. 4B, inner foot 530*b* in FIG. 5B, or inner foot 630*b* in FIG. 6B).

The package assembly 900 may be made by a method similar to the method described above (e.g., see FIG. 7A-7G). In particular, the molded die module 980 may be mounted on the package substrate 110. The molded die module 980 may include metal bonding pads (not shown) that may contact the metal bonding pads 110*a* (see FIG. 1) of the package substrate 110. The TIM film 140 may then be formed on the molded die module 980. The ring portion 930*a* may be mounted on the package substrate 110 around the molded die module 980 by the third adhesive 160*c*. The plate portion 930*d* may then be bonded to the ring portion 930*a* by the fourth adhesive 160*d*, so that the bottom surface 930*d*1 of the plate portion 930*d* contacts the TIM film 140. A plurality of solder balls 110*b* may then be formed on the package substrate 110.

Figure 16C:
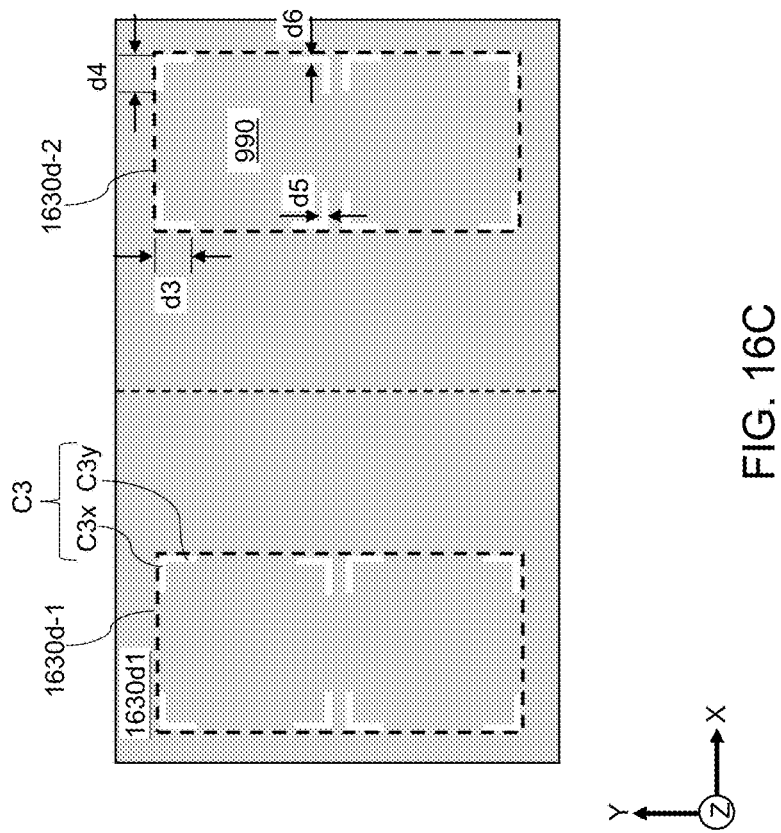
FIG. 16C is a plan view of the bottom surface of the plate portion, according to one or more embodiments.
Figure 16B:
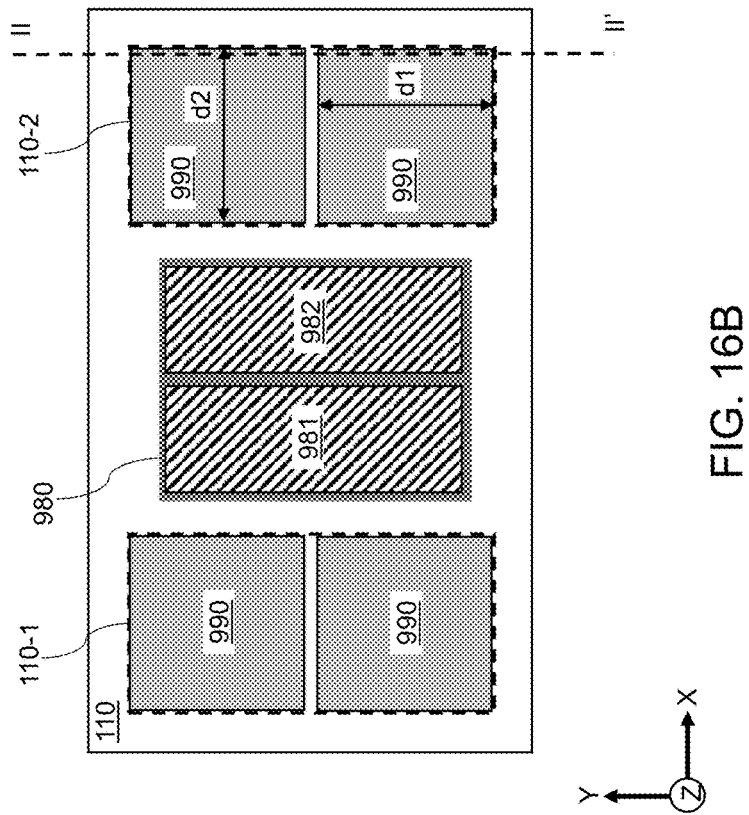
FIG. 16B is a plan view of a surface of the package substrate in the package assembly, according to one or more embodiments.

FIG. 16B is a plan view of a surface of the package substrate 110 in the package assembly 1600, according to one or more embodiments. The package lid 1630 is not illustrated in FIG. 16B for ease of explanation. The cross-sectional view in FIG. 16A is a view along the cross-section II-IF of the package substrate 110 in FIG. 16B.

As illustrated in FIG. 16B, the secondary dies 990 may be formed on the package substrate 110 adjacent to a molded die module 980 such as an integrated fan out package (InFO). The outer perimeter of the secondary dies 990 in FIG. 16B may correspond to the outer perimeter of the TIM films 145 that may be formed on the second dies 990, respectively.

The secondary dies 990 may have a length d2 in the X-direction that is substantially the same or different as the length d1 in the Y-direction. That is, the secondary dies 990 may have a square shape in the plan view. Alternatively, the secondary dies 990 may have a rectangular shape in the plan view, with a longitudinal direction of the rectangular shape being in the X-direction or the Y-direction.

The molded die module 980 may include a first semiconductor die 981 and a second semiconductor die 982 that may be molded together by a molding material. The first semiconductor die 981 and second semiconductor die 982 may be the same as or similar to the semiconductor dies (e.g., 123, 124, 125) described above. In particular, the first semiconductor die 981 and second semiconductor die 982 may include SOC devices. A TIM film (e.g., SOC TIM (not shown)) may be formed on the molded die module 980 and have a thickness that is substantially the same or different than a thickness of the TIM film 145.

The package substrate 110 may include a first package substrate secondary die area 110-1 that may be coextensive with an outer surface of the secondary dies 990 on one side of the molded die module 980. The package substrate 110 may also include a second package substrate secondary die area 110-2 that may be coextensive with an outer surface of the secondary dies 990 on another side (e.g., opposite side) of the molded die module 980.

FIG. 16C is a plan view of the bottom surface 1630d1 of the plate portion 1630d, according to one or more embodiments. The plate portion 1630d may include a first plate portion secondary die area 1630d-1 that (upon assembly of the package assembly 1600) may be aligned with the first package substrate secondary die area 110-1 on the package substrate 110. The plate portion 1630d may also include a second plate portion secondary die area 1630d-2 that (upon assembly of the package assembly 1600) may be aligned with the second package substrate secondary die area 110-2 on the package substrate 110.

As illustrated in FIG. 16C, one or more cavities C3 may be formed in the first plate portion secondary die area 1630d-1 and in the second plate portion secondary die area 1630d-1. The cavities C3 may be formed at locations corresponding to the corners of the secondary dies 990. The cavities C3 may have an angular shape (e.g., right angle shape, L-shape, etc.) that may be aligned with a corner of the secondary dies 990. That is, an outermost edge of the cavities C3 may be substantially aligned with an outermost edge of the secondary dies 990 at a corner of the secondary dies 990.

The cavities C3 may include a first cavity portion C3x extending in the X-direction, and a second cavity portion C3y extending in the Y-direction. A depth of the first cavity portion C3x may be substantially the same or different than a depth of the second cavity portion C3y. The first cavity portion C3x may have a length d4 and a width d5, and the second cavity portion C3y may have the length d3 and a width d6. The length d3 may be substantially the same or different from the length d4, and the width d5 may be substantially the same or different than the width d6.

Each of the length d1 and length d2 of the secondary dies 990 may be greater than zero. Each of the length d4 of the first cavity portion C3x and the length d3 of the second cavity portion C3y may be greater than zero. In one or more embodiments, the length d4 may be in a range from 0.1 mm to 20 mm, and in range from 1% to 20% of a length d2 (in the X-direction) of the secondary die 990.

Each of the width d5 of the first cavity portion C3x and the width d6 of the second cavity portion C3y may be greater than zero. In one or more embodiments, each of the width d5 and the width d6 may be in a range from 0.1 mm to 5 mm.

The length d1 of the secondary die 990 in the Y-direction may be greater than the length d3 of the second cavity portion C3y, and greater than the width d5 of the first cavity portion C3x. The length d2 of the secondary die 990 in the X-direction may be greater than the length d4 of the first cavity portion C3x, and greater than the width d6 of the second cavity portion C3y.

The package assembly 1600 may be made by a method similar to the method described above (e.g., see FIG. 7A-7G). In particular, the molded die module 980 and secondary dies 990 may be mounted on the package substrate 110. A TIM film 145 may then be formed on the molded die module 980. The TIM films 145 may be formed on the secondary dies 990, respectively. The ring portion 1630a may be mounted on the package substrate 110 around the molded die module 980 and the secondary dies 990 by the third adhesive 160c. The plate portion 1630d may then be positioned over the package substrate 110 so as to align the cavities C3 in the plate portion 1630d with the corners of the secondary dies 990. The plate portion 1630d may then be bonded to the ring portion 1630a by the fourth adhesive 160d, so that the bottom surface 1630d1 of the plate portion 1630d contacts the TIM film on the molded die module 980 and contacts the TIM films 145 on the secondary dies 990.

FIGS. 17-20B illustrate four alternative designs of the package assembly 1600. In each of the four alternative designs, the molded die module 980, first package substrate secondary die area 110-1 and second package substrate secondary die area 110-2, first plate portion secondary die area 1630d-1 and second plate portion secondary die area 1630d-2, may all be substantially the same as described above with respect to FIGS. 16B-16C.

Figure 17:
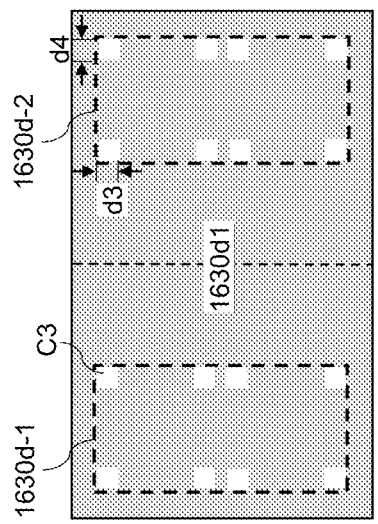
FIG. 17 is a plan view of the bottom surface of the plate portion in a first alternative design of the package assembly, according to one or more embodiments.

FIG. 17 is a plan view of the bottom surface 1630d1 of the plate portion 1630d in a first alternative design of the package assembly 1600, according to one or more embodiments. The package substrate 110 in the first alternative design is substantially the same as FIG. 16B. As illustrated in FIG. 17, in the first alternative design, the cavities C3 in the first plate portion secondary die area 1630d-1 and second plate portion secondary die area 1630d-1 may be located the corners of the four secondary dies 990 shown in FIG. 16B. The cavities C3 may have a square shape (or rectangular shape) in the plan view. A corner of the square shape may be aligned with a corner of the secondary dies 990. That is, an outermost edge of the cavities C3 may be substantially aligned with an outermost edge of the secondary dies 990 at a corner of the secondary dies 990. The cavities C3 may have the length d4 in the X-direction and the length d3 in the Y-direction.

The length d3 and length d4 of the cavities C3 may be the same or different. A depth of the cavities C3 may be substantially the same or different. Thus, for example, a depth of a cavity C3 in the first plate portion secondary die area 1630d-1 may be the same or different than a depth of a cavity C3 in the second plate portion secondary die area 1630d-1.

Figure 18:
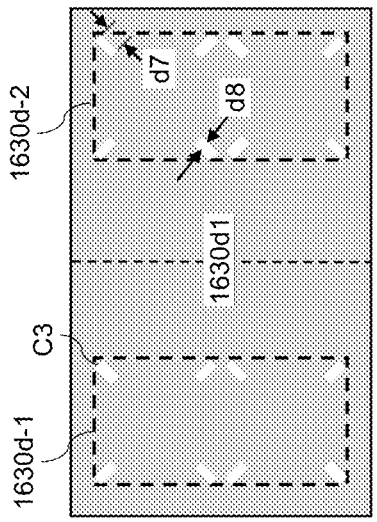
FIG. 18 is a plan view of the bottom surface of the plate portion in a second alternative design of the package assembly, according to one or more embodiments.

FIG. 18 is a plan view of the bottom surface 1630d1 of the plate portion 1630d in a second alternative design of the package assembly 1600, according to one or more embodiments. The package substrate 110 in the second alternative design is substantially the same as FIG. 16B. As illustrated in FIG. 18, in the second alternative design, the cavities C3 in the first plate portion secondary die area 1630d-1 and second plate portion secondary die area 1630d-1 may be located at the corners of the four secondary dies 990 shown in FIG. 16B. The cavities C3 may have a line shape in the plan view and intersect the corners of the secondary dies 990 at a 45° angle. In some embodiments, the cavities C3 may have a line shape in the plan view and intersect the corners of the secondary dies 990 at another angle. An end of the line shape may be aligned with a corner of the secondary dies 990. That is, an outermost edge of the cavities C3 may be substantially aligned with an outermost edge of the secondary dies 990 at a corner of the secondary dies 990. The cavities C3 may have a length d7 that is substantially the same as the length d3 and the length d4 described above with respect to FIG. 16C. The cavities C3 may have a width d8 that is substantially the same as the width d5 and the width d6 described above with respect to FIG. 16C. The length d7 and width d8 of the cavities C3 may be the same or different.

FIG. 19A is a plan view of the package substrate 110 in a third alternative design of the package assembly 1600, according to one or more embodiments. In the third alternative design, the first package substrate secondary die area 110-1 includes one secondary die 990 that is centrally located in the Y-direction. The second package substrate secondary die area 110-2 also includes one secondary die 990 that is centrally located in the Y-direction.

FIG. 19B is a plan view of the bottom surface 1630d1 of the plate portion 1630d in the third alternative design of the package assembly 1600, according to one or more embodiments. As illustrated in FIG. 19B, in the third alternative design, the cavities C3 in the first plate portion secondary die area 1630d-1 and second plate portion secondary die area 1630d-1 may be located the corners of the two secondary dies 990 in FIG. 19A. The cavities C3 may be similar (e.g., in terms of shape, location, etc.) to that described above with respect to FIG. 17. That is, the cavities C3 may have a square shape that is aligned with a corner of the secondary dies 990, have a length d4 in the X-direction and a length d3 in the Y-direction, and so on.

FIG. 20A is a plan view of the package substrate 110 in a fourth alternative design of the package assembly 1600, according to one or more embodiments. In the fourth alternative design, the first package substrate secondary die area 110-1 includes one secondary die 990 that is located at an end of the first package substrate secondary die area 110-1 in the Y-direction. The second package substrate secondary die area 110-2 includes two secondary dies 990 similar to the second package substrate secondary die area 110-2 in FIG. 16B.

FIG. 20B is a plan view of the bottom surface 1630d1 of the plate portion 1630d in the fourth alternative design of the package assembly 1600, according to one or more embodiments. As illustrated in FIG. 20B, in the fourth alternative design, the cavities C3 in the first plate portion secondary die area 1630d-1 and second plate portion secondary die area 1630d-1 may be located the corners of the three secondary dies 990 shown in FIG. 20A. The cavities C3 may be similar (e.g., in terms of shape, location, etc.) to that described above with respect to FIG. 17. That is, the cavities C3 may have a square shape that is aligned with a corner of the secondary dies 990, have a length d4 in the X-direction and a length d3 in the Y-direction, and so on.

Referring now to FIGS. 21A-22D, one or more embodiments may include a package lid having an inner foot (e.g., inner rib or inner lid rib). The inner foot may improve coverage in a TIM film (e.g., a film-type TIM such as a graphite TIM) in a package assembly (e.g., electronic package). In a typical package assembly, a poor thermal performance (e.g., thermal resistance of about 0.1 C/cm^2) of a film-type TIM may be induced by a lower coverage due to a small width of a package lid. However, the package lid with the inner foot may improve the coverage (e.g., coverage contour of good thermal performance of the TIM film) as compared to a typical package lid. In particular, the coverage by the package lid with the inner foot may be about 91% or more. The inner foot may help to increase coverage of the TIM film for good thermal performance with little or no increment of stress level in components, such as the dies. The inner foot design may be implemented, for example, in any die or mold structure.

The package lid may include the inner foot near a small foot width side (e.g., narrow lid foot width side) of the package lid. The package assembly may also have adhesive pattern on the package substrate that corresponds to the inner foot of the package lid. The inner foot of the package lid may help to increase coverage between the package lid and an interposer module (e.g., CoW die) that is covered by the package lid and provide better thermal performance in the package assembly.

The package assembly with the package lid having an inner foot may be formed by a method similar to that described above for the package assembly 100, and illustrated in FIGS. 7A-7G (e.g., a film-type TIM process). In this method, a plurality of the TIM films (FTIM) may be formed on a tape. The tape may be put on attachment rollers which are turned to attach the plurality of TIM films to a plurality of the interposer modules (e.g., COW dies), respectively. The package lid may then be attached (e.g., by an automated pick-and-place device) to the package substrate so as to contact the TIM film. An adhesive pattern may be formed on a surface of the package substrate. The package lid may then be positioned over the package substrate and aligned with adhesive pattern. A hot clamp device may then apply high pressure and temperature to the package lid in order to clamp the package lid onto the adhesive and package substrate.

Figure 21A:
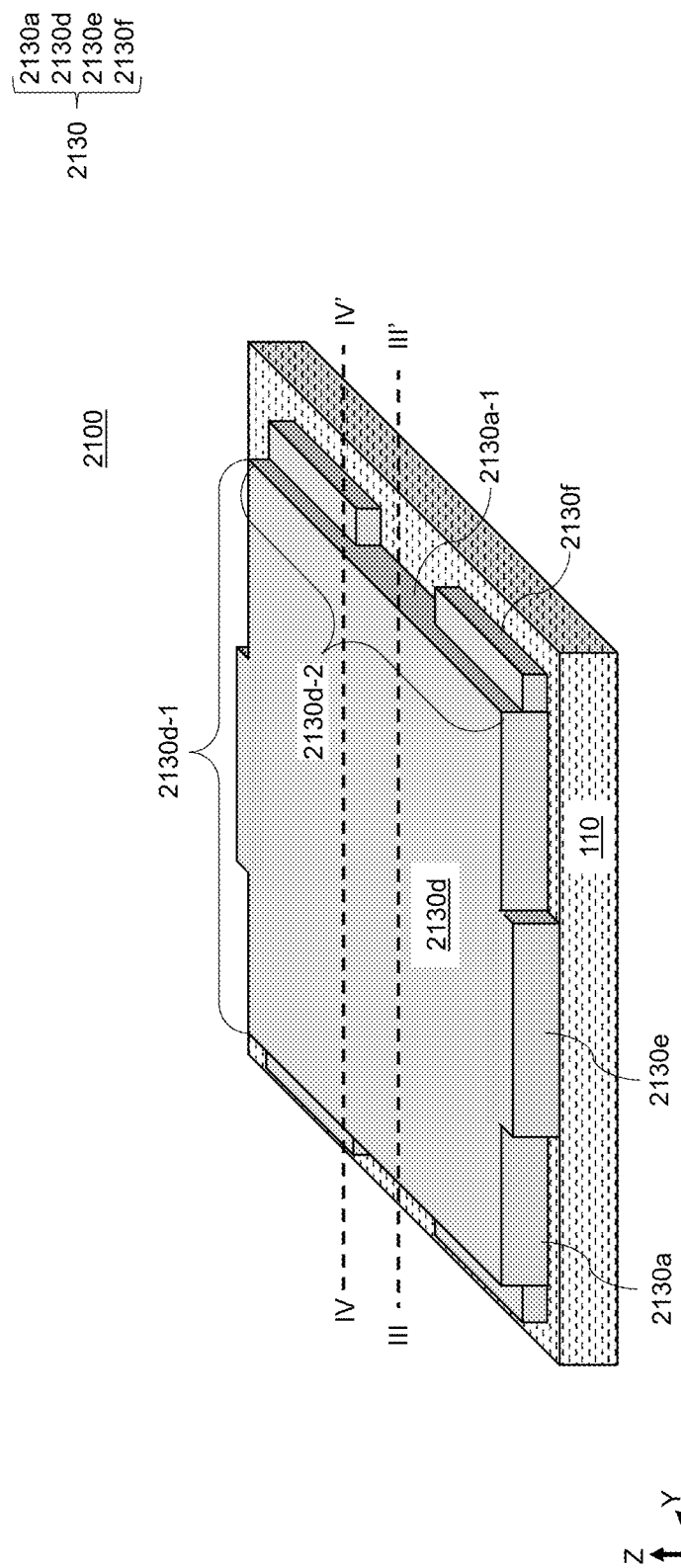
FIG. 21A illustrates a package assembly according to one or more embodiments.

FIG. 21A illustrates a package assembly 2100 according to one or more embodiments. The package assembly 2100 includes the package substrate 110 and a package lid 2130 mounted on the package substrate 110. The package lid 2130 may include a plate portion 2130d and an outer foot 2130a that may be formed around a perimeter of the plate portion 2130d. The plate portion 2130d may include a pair of first sides 2130d-1 and a plate portion extension 2130e that extends from the first sides 2130d-1. The plate portion extension 2103e may be positioned in a central portion of the first sides 2130d-1. The plate portion extension 2130e may have a length (in the X-direction) that is in a range of 20% to 40% of the length of the first side 2130d-1. The plate portion extension 2103e may extend in a Z-direction from a bottom surface of the outer foot 2130a to an upper surface of the plate portion 2130d. A width of the plate portion extension 2130e (in the Y-direction) may be in a range from 25% to 75% of a width of the outer foot 2130a.

The plate portion 2130d may also include a pair of second sides 2130d-2 (e.g., small foot width side) that connects the pair of first sides 2130d-1 at opposing ends of the pair of first sides 2130d-1. The plate portion 2130d may also include one or more step portions 2130f that extend from the outer foot 2130a at the pair of second sides 2130d-2. The step portion 2130f may have a width (in the X-direction) that is in a range from 50% to 150% of the width of the outer foot 2130a (in the X-direction). The step portion 2130f may have a length (in the Y-direction) that is in a range from 20% to 45% of the length of the second side 2130d-2 of the plate portion 2130d. The step portion 2130f may extend in the Z-direction along an entire length of the outer foot 2130a. That is, an upper surface of the step portion 2130f may be substantially co-planar with a bottom surface of the plate portion 2130d.

The step portion 2130f may have a first end that is substantially aligned with an end of the second side 2130d-2 of the plate portion 2130d, and a second end that is opposite the first end. The outer foot 2130a may include an outer foot exposed portion 2130a-1 (e.g., narrow foot side) that is positioned between the second ends of a pair of the step portions 2130f. A length of the outer foot exposed portion 2130a-1 (in the Y-direction) may be in a range from 10% to 60% of the length of the second side 2130d-2 of the plate portion 2130d (in the Y-direction). The length of the outer foot exposed portion 2130a-1 (in the Y-direction) may also be in a range from 20% to 80% of the length of the plate portion extension 2130e (in the X-direction).

Figure 21B:
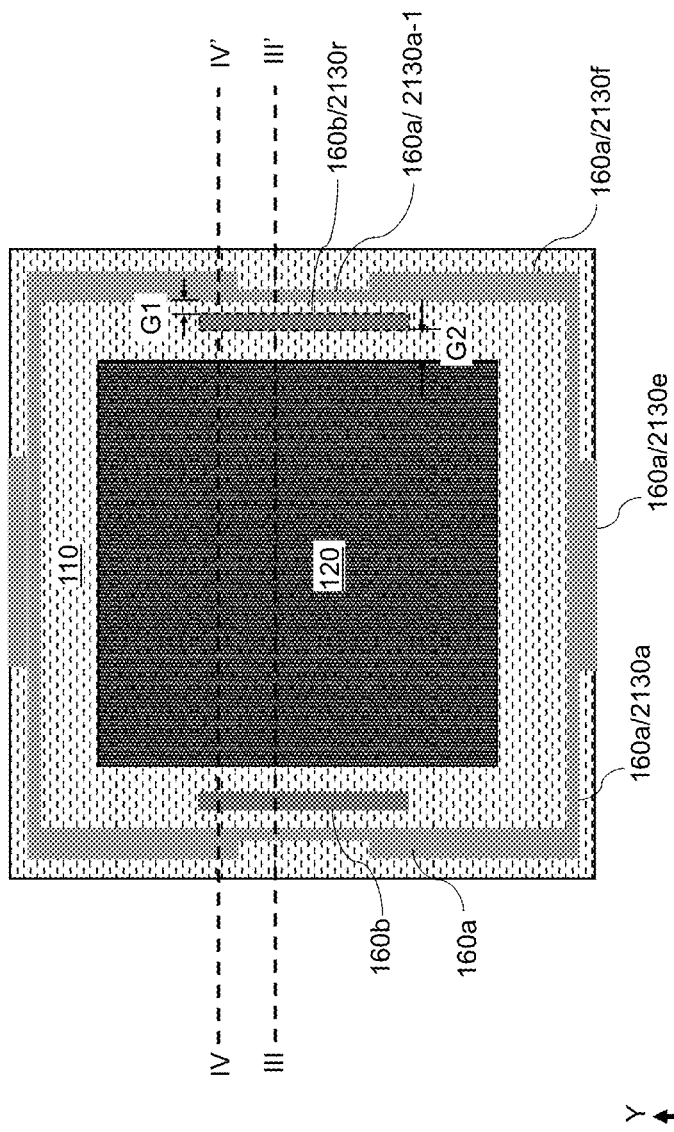
FIG. 21B is a plan view of the package substrate in the package assembly, according to one or more embodiments.

FIG. 21B is a plan view of the package substrate 110 in the package assembly 2100, according to one or more embodiments. The package lid 2130 may be attached to the package substrate 110 by a first adhesive 160a and second adhesive 160b which have an adhesive pattern as illustrated in FIG. 21B. The package lid 2130 may contact the package substrate 110 at points corresponding to a location of the first adhesive 160a and second adhesive 160b. Thus, the outline of the first adhesive 160a and second adhesive 160b in FIG. 21D may also constitute an outline of the package lid 2130 on the package substrate 110. The various parts of the package lid 2130 contacting the package substrate 110 through the adhesive pattern may also be indicated in FIG. 21B.

As illustrated in FIG. 21B, the interposer module 120 (e.g., electronic package) may be located at a center of the package lid 2130 in the plan view. The outer foot 2130a may be formed around the perimeter of the interposer module 120. The outer foot 2130a may have a uniform width around the perimeter of the interposer module 120. The plate portion extensions 2130e and step portions 2130f may be located on a side of the outer foot 2130a. The outer foot exposed portion 2130a-1 may be located between the step portions 2130f.

The package lid 2130 may also include an inner foot 2130r that is located inside the outer foot 2130a. The inner foot 2130r may be located between the interposer module 120 and the outer foot exposed portion 2130a-1. A center point of the inner foot 2130r in the Y-direction may be substantially aligned with a center point of the outer foot exposed portion 2130a-1 in the Y-direction. A length of the inner foot 2130r in the Y-direction may be in a range from 50% to 150% of the length of the outer foot exposed portion 2130a-1 in the Y-direction. The inner foot 2130r may be separated from the outer foot exposed portion 2130a-1 by a first distance G1. The inner foot 2130r may be separated from the interposer module 120 by a second distance G2. In one or more embodiments, the second distance G2 is greater than the first distance G1. The first distance G2 may alternatively be less than or substantially the same as the second distance G1.

Figure 21C:
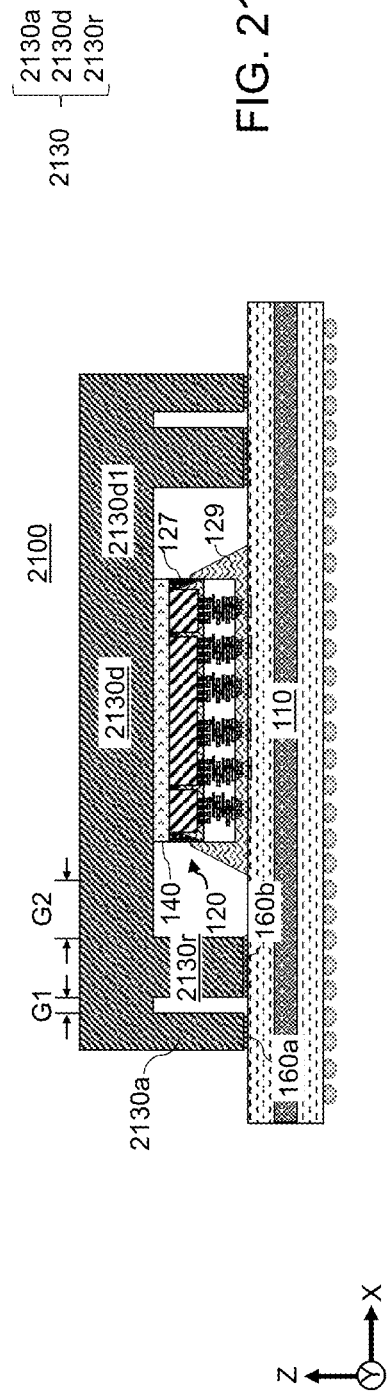
FIG. 21C is a vertical cross-sectional view of the package assembly, according to one or more embodiments.

FIG. 21C is a vertical cross-sectional view of the package assembly 2100, according to one or more embodiments. The vertical cross-sectional view of the package assembly 2100 in FIG. 21C is a view along the line III-III' in FIGS. 21A and 21B.

As illustrated in FIG. 21C, the package assembly 2100 includes the interposer module 120 mounted on the package substrate 110. The interposer module 120 may include, for example, a semiconductor die, SOC die, dummy die, etc. The package underfill layer 129 may be formed under and around the interposer module 120 on the package substrate 110. The interposer module 120 may also include the molding material layer 127 that is formed on the semiconductor dies in the interposer module 120.

The TIM film 140 (e.g., graphite TIM film) may be formed on an upper surface of the interposer module 120. In particular, the TIM film 140 may be formed on the molding material layer 127 that may constitute at least a portion of the upper surface of the interposer module 120. The package lid 2130 may be formed over the interposer module 120 and attached to the package substrate 110 through the first adhesive 160a and second adhesive 160b. A bottom surface 2130d1 of the plate portion 2130d of the package lid 2130 may contact an upper surface of the TIM film 140.

As illustrated in FIG. 21C, the outer foot 2130a of the package lid 2130 may project downward in the Z-direction from the bottom surface 2130d1 of the plate portion 2130d. The inner foot 2130r may be located between the outer foot 2130a and the interposer module 120. The inner foot 2130r may project in the Z-direction from the bottom surface 2130d1 of the plate portion 2130d. The inner foot 2130r may be attached to the package substrate 110 through the second adhesive 160b.

The inner foot 2130r may have a width (in the X-direction) that is greater than a width of the outer foot 2130a. The inner foot 2130r may be separated from the interposer module 120 (in particular, the package underfill layer 129) by a distance G2, and separated from the outer foot 2130a by a distance G1.

Figure 21D:
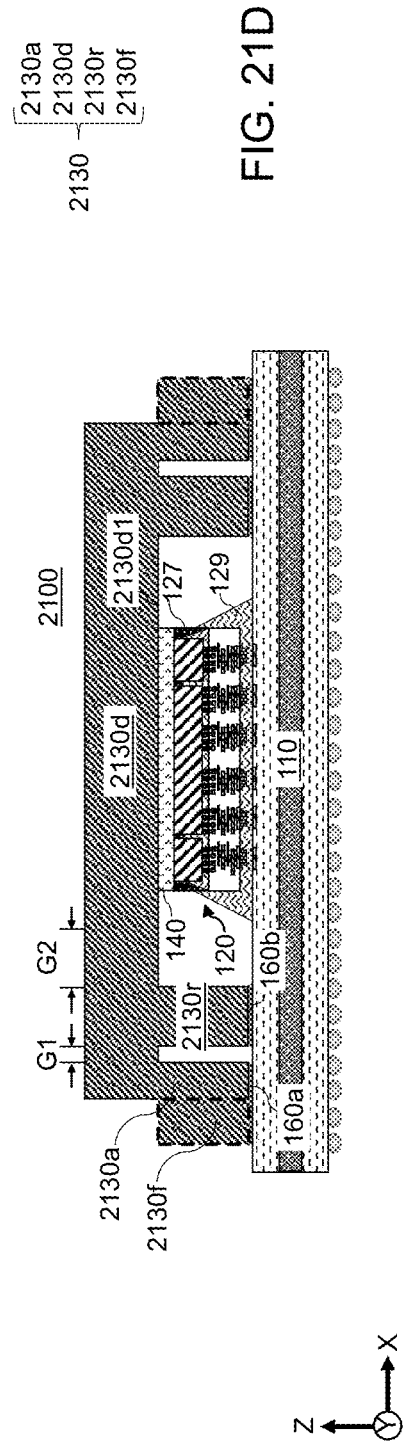
FIG. 21D is a vertical cross-sectional view of the package assembly, according to one or more embodiments.

FIG. 21D is a vertical cross-sectional view of the package assembly 2100, according to one or more embodiments. The vertical cross-sectional view of the package assembly 2100 in FIG. 21D is a view along the line IV-IV' in FIGS. 21A and 21B.

The vertical cross-sectional view in FIG. 21D may be substantially the same as the vertical cross-sectional view in FIG. 21C, except that the vertical cross-sectional view in FIG. 21D includes the step portion 2130f that may be formed on an outer sidewall of the outer foot 2130a. As illustrated in FIG. 21D, a length of the step portion 2130f may be substantially the same as the length of the outer foot 2130a.

The inner foot 2130r in the package assembly 2100 may improve coverage in the TIM film 140. That is, the package lid 2130 with the inner foot 2130r may improve the coverage (e.g., coverage contour of good thermal performance of the TIM film 140) as compared to a typical package lid. In particular, the coverage by the package lid 2130 with the inner foot 2130r may be about 91% or more. The inner foot 2130r may help to increase coverage of the TIM film 140 for good thermal performance with little or no increment of stress level in components, such as the dies.

The package assembly 2100 with the package lid 2130 having the inner foot 2130r may be formed by a method similar to that described above for the package assembly 100, and illustrated in FIGS. 7A-7G (e.g., a film-type TIM process). In this method, a plurality of the TIM films 140 (FTIM) may be formed on a tape. The tape may be put on attachment rollers which are turned to attach the plurality of TIM films 140 to a plurality of the interposer modules 120 (e.g., COW dies), respectively. The package lid 2130 may then be attached (e.g., by an automated pick-and-place device) to the package substrate 110 so as to contact the TIM film 140. An adhesive pattern may be formed on a surface of the package substrate 110. The package lid 2130 may then be positioned over the package substrate 110 and aligned with adhesive pattern. A hot clamp device may then apply high pressure and temperature to the package lid 2130 in order to clamp the package lid 2130 onto the adhesive and package substrate 110.

FIGS. 22A-22D illustrate alternative designs of the package assembly 2100 according to one or more embodiments. It should be noted that in each of the FIGS. 22A-22D, the adhesive pattern of the first adhesive 160a may be substantially the same as the adhesive pattern of the first adhesive 160a in FIG. 21B. The difference between the alternative designs in FIGS. 22A-22D and the design in FIG. 21B may be the size and location of the second adhesive 160b. As in FIG. 21B, the second adhesive 160b may also be identified as the inner foot 2130r in FIGS. 22A-22D.

Figure 22A:
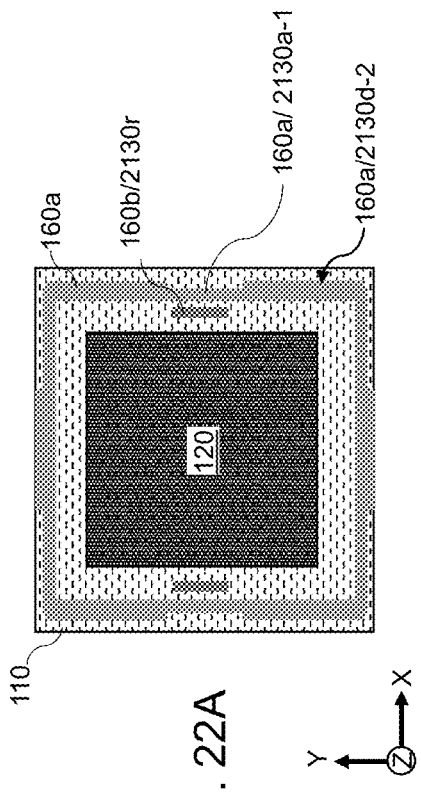
FIG. 22A is a plan view of the package substrate in a first alternative design of the package assembly, according to one or more embodiments.

FIG. 22A is a plan view of the package substrate 110 in a first alternative design of the package assembly 2100, according to one or more embodiments. The first alternative design may include two inner feet 2130r on opposing sides of the interposer module 120 in the X-direction. The inner feet 2130r may extend longitudinally along the second side 2130d-2 of the plate portion 2130d. The inner foot 2130r may be located inside the outer foot exposed portion 2130a-1. The inner foot 2130r may have a length in the Y-direction that is less than a length in the Y-direction of the outer foot exposed portion 2130a-1. In one or more embodiments, the inner foot 2130r may have a length in the Y-direction that is in a range from 50% to 120% of the length in the Y-direction of the outer foot exposed portion 2130a-1.

Figure 22B:
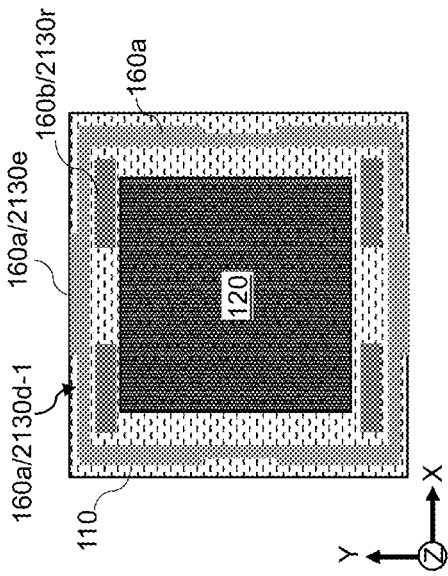
FIG. 22B is a plan view of the package substrate in a second alternative design of the package assembly, according to one or more embodiments.

FIG. 22B is a plan view of the package substrate 110 in a second alternative design of the package assembly 2100, according to one or more embodiments. The second alternative design may include four inner feet 2130r. Two of the inner feet 2130r may be formed on one side of the interposer module 120, and the other two inner feet 2130r may be formed on an opposing side of the interposer module 120 in the Y-direction. The inner feet 2130r may extend longitudinally along the first side 2130d-1 of the plate portion 2130d. At least a portion of the inner foot 2130r may be formed between the plate portion extension 2130e. The inner foot 2130r may have a length in the X-direction that is less than a length in the X-direction of the plate portion extension 2130e. In one or more embodiments, the inner foot 2130r may have a length in the X-direction that is in a range from 40% to 80% of the length in the X-direction of the plate portion extension 2130e.

Figure 22C:
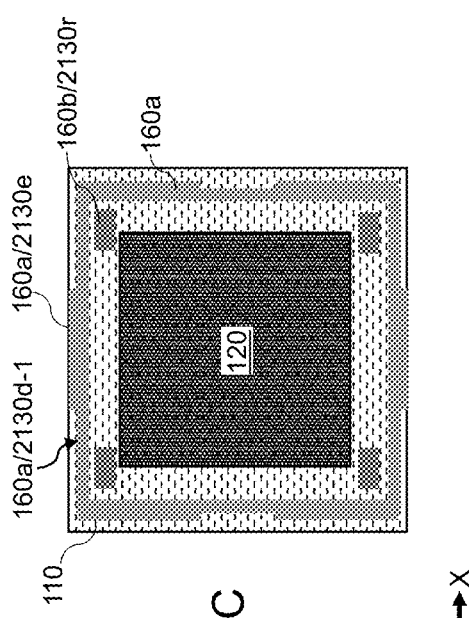
FIG. 22C is a plan view of the package substrate in a third alternative design of the package assembly, according to one or more embodiments.

FIG. 22C is a plan view of the package substrate 110 in a third alternative design of the package assembly 2100, according to one or more embodiments. The third alternative design may be substantially the same as the second alternative design in FIG. 22B and include four inner feet 2130r. In one or more embodiments, the inner foot 2130r may have a length in the X-direction that is in a range from 20% to 60% of the length in the X-direction of the plate portion extension 2130e.

Figure 22D:
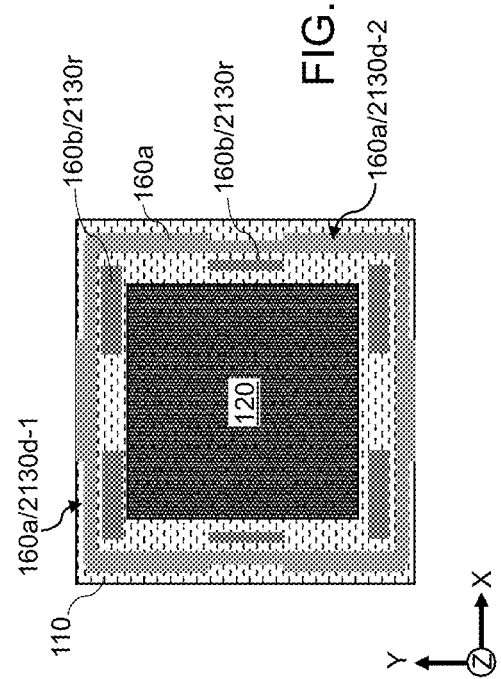
FIG. 22D is a plan view of the package substrate in a fourth alternative design of the package assembly, according to one or more embodiments.

FIG. 22D is a plan view of the package substrate 110 in a fourth alternative design of the package assembly 2100, according to one or more embodiments. The fourth alternative design may include a first pair of inner feet 2130r having an arrangement as in the first alternative design of FIG. 22A. The fourth alternative design may also include two pairs of inner feet 2130r having an arrangement as in the second alternative design of FIG. 22B.

Referring to FIGS. 1A-8, in one or more embodiments a package assembly 100 may include a package substrate 110, a package lid 130 on the package substrate 110 and including a plate portion 130d, an outer foot 130a extending from the plate portion 130d, and an inner foot 130b having a height $H_{bz}$ greater than or equal to a height $H_{az}$ of the outer foot 130a, extending from the plate portion 130d and including a first inner foot corner portion 130b1 located inside a first corner of the outer foot 130a, and an adhesive 160 that adheres the outer foot 130a to the package substrate 110 and adheres the inner foot 130b to the package substrate 110. The height $H_{bz}$ of the inner foot 130b may be substantially equal to the height $H_{az}$ of the outer foot 130a. The height $H_{bz}$ of the inner foot 130b may be greater than the height $H_{az}$ of the outer foot 130a. The outer foot 130a may extend from the plate portion 130d by a first distance and the inner foot 130b may extend from the plate portion 130d by a second distance greater than the first distance. The package substrate 110 may include a recessed portion 111, 113 and the inner foot 130b may be adhered to the package substrate 110 inside the recessed portion 111, 113. The package substrate 110 may include a core substrate 112 and an upper insulating layer 114 on the core substrate, and the recessed portion 111, 113 may be formed in the upper insulating layer 114. The inner foot 130b may be adhered inside the recessed portion 111, 113 to the upper insulating layer 114. The inner foot 130b may be adhered inside the recessed portion 111, 113 to the core substrate. The outer foot 130a may include a first outer foot 130a side and a second outer foot 130a side, and the first inner foot corner portion 130b1 of the inner foot 130b may include a first inner foot corner portion side extending along the first outer foot 130a side and having a length $L_{b1}$ that may be less than a length $L_{ax}$ of the first outer foot 130a side. The first inner foot corner portion 130b1 of the inner foot 130b further may include a second inner foot corner portion side extending along the second outer foot 130a side and having a length $L_{b1}$ that may be less than a length $L_{ay}$ of the second outer foot 130a side (e.g., $L_{b1} \geq 0.1 \times L_{ax}$ and $L_{b1} \geq 0.1 \times L_{ay}$). The inner foot 130b further may include a second inner foot corner portion 130b1 located inside a second corner of the outer foot 130a, and the second inner foot corner portion 130b1 may be separate from the first inner foot corner portion 130b1. The inner foot 130b further may include a first line portion between the first inner foot corner portion 130b1 and the second inner foot corner portion 130b1. A thickness of the inner foot 130b may be greater than a thickness of the outer foot 130a. A distance between the inner foot 130b and the outer foot 130a may be greater than 500 µm. The package assembly 100 may further include, an interposer module 120 mounted on the package substrate 110 under the plate portion 130d of the package lid 130, and a thermal interface material (TIM) film 140 on the interposer module 120 and between the interposer module 120 and the plate portion 130d of the package lid 130. A distance between the inner foot 130b and the TIM film may be greater than 1000 µm.

Referring to FIGS. 1A-8, a method of making a package assembly 100 may include forming an adhesive 160 on a package substrate 110, placing a package lid 130 on the adhesive 160, the package lid 130 may include a plate portion 130d, an outer foot 130a extending from the plate portion 130d, and an inner foot 130b extending from the plate portion 130d and including a first inner foot corner portion 130b1 located inside a first corner of the outer foot 130a, and pressing the package lid 130 onto the package substrate 110 and curing the adhesive 160 so that the adhesive 160 adheres the outer foot 130a to the package substrate 110 and the inner foot 130b to the package substrate 110. The method may further may include forming a recessed portion 111, 113 in the package substrate 110, wherein the forming of the adhesive 160 may include forming the adhesive 160 in the recessed portion 111, 113 and the placing of the package lid 130 on the adhesive 160 may include placing the inner foot 130b inside the recessed portion 111, 113. The package substrate 110 may include a core substrate and an upper insulating layer 114 on the core substrate, and the forming of the recessed portion 111, 113 may include forming the recessed portion 111, 113 in the upper insulating layer 114. The placing of the inner foot 130b inside the recessed portion 111, 113 may include placing the inner foot 130b on the core substrate inside the recessed portion 111, 113.

Referring to FIGS. 1A-8, a package assembly 100 may include a package substrate 110 including a core layer, and an insulating layer on the core layer and including a recessed portion 111, 113, a package lid 130 on the package substrate 110 and including a plate portion 130d, an outer foot 130a extending from the plate portion 130d and having a first height and an inner foot 130b extending from the plate portion 130d and having a second height greater than or equal to the first height, the inner foot 130b extending into the recessed portion 111, 113 of the insulating layer and including a first inner foot corner portion 130b1 located inside a first corner of the outer foot 130a and a second inner foot corner portion 130b1 located inside a second corner of the outer foot 130a and separated from the first inner foot corner portion 130b1, an adhesive 160 that adheres the outer foot 130a to the package substrate 110 and adheres the inner foot 130b to the package substrate 110, an interposer module mounted on the package substrate 110 under the plate portion 130d of the package lid 130, and a thermal interface material (TIM) film 140 on the interposer module 120 and between the interposer module 120 and the plate portion 130d of the package lid 130.

Referring to FIGS. 9-20B, a package assembly 900/1600 may include a package substrate 110, a molded die module 980 on the package substrate 110, a secondary die 990 on the package substrate 110 adjacent to the molded die module 980, and a package lid 930/1630 including a ring portion 930a/1630a around the molded die module 980 and the secondary die 990 on the package substrate 110, and a plate portion 930d/1630d on the ring portion 930a/1630a and over the molded die module 980 and secondary die 990, and including a cavity C1, C2, C2', C3 that is located at one of an edge of the molded die module 980 or a corner of the secondary die 990.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package assembly comprising:
   a package substrate;
   a package lid on the package substrate, comprising:
   a plate portion;
   an outer foot extending from the plate portion; and
   an inner foot having a height greater than or equal to a height of the outer foot, extending from the plate portion and including a first inner foot corner portion located inside a first corner of the outer foot; and
   an adhesive that adheres the outer foot to the package substrate and adheres the inner foot to the package substrate.

2. The package assembly of claim 1, wherein the height of the inner foot is substantially equal to the height of the outer foot.

3. The package assembly of claim 1, wherein the height of the inner foot is greater than the height of the outer foot.

4. The package assembly of claim 3, wherein the package substrate comprises a recessed portion and the inner foot is adhered to the package substrate inside the recessed portion.

5. The package assembly of claim 4, wherein the package substrate comprises a core substrate and an upper insulating layer on the core substrate, and the recessed portion is formed in the upper insulating layer.

6. The package assembly of claim 5, wherein the inner foot is adhered inside the recessed portion to the upper insulating layer.

7. The package assembly of claim 5, wherein the inner foot is adhered inside the recessed portion to the core substrate.

8. The package assembly of claim 1, wherein the outer foot comprises a first outer foot side and a second outer foot side, and the first inner foot corner portion comprises a first inner foot corner portion side extending along the first outer foot side and having a length $L_{b1}$ that is less than a length $L_{ax}$ of the first outer foot side.

9. The package assembly of claim 8, wherein the first inner foot corner portion further comprises a second inner foot corner portion side extending along the second outer foot side and having a length $L_{b1}$ that is less than a length $L_{ay}$ of the second outer foot side.

10. The package assembly of claim 9, wherein $L_{b1} \geq 0.1 \times L_{ax}$ and $L_{b1} \geq 0.1 \times L_{ay}$.

11. The package assembly of claim 1, wherein the inner foot further comprises a second inner foot corner portion located inside a second corner of the outer foot, and the second inner foot corner portion is separate from the first inner foot corner portion.

12. The package assembly of claim 11, wherein the inner foot further comprises a first inner foot line portion between the first inner foot corner portion and the second inner foot corner portion.

13. The package assembly of claim 1, wherein a thickness of the inner foot is greater than a thickness of the outer foot.

14. The package assembly of claim 1, wherein a distance between the inner foot and the outer foot is greater than 500 µm.

15. The package assembly of claim 1, further comprising:
   an interposer module mounted on the package substrate under the plate portion of the package lid; and
   a thermal interface material (TIM) film on the interposer module and between the interposer module and the plate portion of the package lid,
   wherein a distance between the inner foot and the TIM film is greater than 1000 µm.

16. A method of making a package assembly, the method comprising:
   forming an adhesive on a package substrate;
   placing a package lid on the adhesive, the package lid comprising:
   a plate portion;
   an outer foot extending from the plate portion; and
   an inner foot having a height greater than or equal to a height of the outer foot, extending from the plate portion and including a first inner foot corner portion located inside a first corner of the outer foot; and
   pressing the package lid onto the package substrate and curing the adhesive so that the adhesive adheres the outer foot to the package substrate and the inner foot to the package substrate.

17. The method of claim 16, further comprising:
   forming a recessed portion in the package substrate,
   wherein the forming of the adhesive comprises forming the adhesive in the recessed portion and the placing of the package lid on the adhesive comprises placing the inner foot inside the recessed portion.

18. The method of claim 17, wherein the package substrate comprises a core substrate and an upper insulating layer on the core substrate, and the forming of the recessed portion comprises forming the recessed portion in the upper insulating layer.

19. The method of claim 18, wherein the placing of the inner foot inside the recessed portion comprises placing the inner foot on the core substrate inside the recessed portion.

20. A package assembly comprising:
   a package substrate;
   a molded die module on the package substrate, wherein the molded die module comprises a plurality of semiconductor dies separated by a molding gap extending lengthwise in a first direction;
   a secondary die on the package substrate adjacent to the molded die module; and
   a package lid comprising:
      a ring portion around the molded die module on the package substrate; and
      a plate portion on the ring portion and over the molded die module and secondary die, and including:
         a first cavity that is located at an edge of the molded die module; and
         a second cavity extending lengthwise in the first direction and substantially aligned with the molding gap.

* * * * *